(12) United States Patent
Umezawa et al.

(10) Patent No.: US 12,507,594 B2
(45) Date of Patent: Dec. 23, 2025

(54) PIEZOELECTRIC DEVICE

(71) Applicant: Murata Manufacturing Co., Ltd., Nagaokakyo (JP)

(72) Inventors: Seiji Umezawa, Nagaokakyo (JP); Shinsuke Ikeuchi, Nagaokakyo (JP); Masayuki Suzuki, Nagaokakyo (JP); Matti Liukku, Nagaokakyo (JP); Ville-Pekka Rytkönen, Nagaokakyo (JP); Anssi Blomqvist, Nagaokakyo (JP); Ville Kaajakari, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 737 days.

(21) Appl. No.: 17/967,931

(22) Filed: Oct. 18, 2022

(65) Prior Publication Data
US 2023/0038607 A1  Feb. 9, 2023

Related U.S. Application Data

(63) Continuation of application No. PCT/JP2021/002409, filed on Jan. 25, 2021.

(30) Foreign Application Priority Data

Apr. 30, 2020 (JP) .................................. 2020-080440

(51) Int. Cl.
*H01L 41/02* (2006.01)
*B06B 1/06* (2006.01)
(Continued)

(52) U.S. Cl.
CPC ........... *H10N 30/2041* (2023.02); *B06B 1/06* (2013.01); *H10N 30/85* (2023.02); *H10N 30/87* (2023.02)

(58) Field of Classification Search
CPC .... H10N 30/2041; H10N 30/85; H10N 30/87; H10N 30/2047; B06B 1/06; B06B 1/0603
(Continued)

(56) References Cited

U.S. PATENT DOCUMENTS

2011/0265564 A1  11/2011  Acar et al.
2012/0053393 A1  3/2012  Kaltenbacher et al.
(Continued)

FOREIGN PATENT DOCUMENTS

JP       2011004129 A    1/2011
JP       2014515214 A    6/2014
(Continued)

OTHER PUBLICATIONS

Office Action in JP2022-518605, mailed Aug. 1, 2023, 7 pages.
(Continued)

*Primary Examiner* — Derek J Rosenau
(74) *Attorney, Agent, or Firm* — Keating & Bennett, LLP

(57) ABSTRACT

A piezoelectric device includes a connection section including a first coupling portion, a second coupling portion, and a bridging portion. The first coupling portion extends along a slit and is connected to one of a pair of beam sections. The second coupling portion extends along the slit and is connected to another of the pair of beam sections. The bridging portion is located between the slit and an opening and is connected to both of the first coupling portion and the second coupling portion. The beam sections are connected to each other in a circumferential direction of a base having an annular shape via the connecting section while each of the beam sections is interposed between the slits extending in intersecting directions.

20 Claims, 12 Drawing Sheets

(51) Int. Cl.
   *H10N 30/20* (2023.01)
   *H10N 30/85* (2023.01)
   *H10N 30/87* (2023.01)

(58) Field of Classification Search
   USPC ........................................ 310/328, 330, 332
   See application file for complete search history.

(56) References Cited

U.S. PATENT DOCUMENTS

| | | |
|---|---|---|
| 2012/0250909 A1 | 10/2012 | Grosh et al. |
| 2019/0110132 A1 | 4/2019 | Littrell |
| 2020/0100033 A1 | 3/2020 | Stoppel et al. |
| 2022/0329951 A1* | 10/2022 | Umezawa ................ H03H 9/17 |

FOREIGN PATENT DOCUMENTS

| | | | |
|---|---|---|---|
| JP | 2015108633 A | 6/2015 | |
| JP | 2017022576 A | 1/2017 | |

OTHER PUBLICATIONS

International Search Report in PCT/JP2021/002409, mailed Apr. 6, 2021, 4 pages.

Written Opinion in PCT/JP2021/002409, mailed Apr. 6, 2021, 6 pages.

* cited by examiner

AXIAL DIRECTION OF VIRTUAL AXIS

AXIAL DIRECTION OF VIRTUAL AXIS

PIEZOELECTRIC DEVICE

CROSS REFERENCE TO RELATED APPLICATIONS

This application claims the benefit of priority to Japanese Patent Application No. 2020-080440, filed on Apr. 30, 2020, and is a Continuation Application of PCT Application No. PCT/JP2021/002409, filed on Jan. 25, 2021. The entire contents of each application are hereby incorporated herein by reference.

BACKGROUND OF THE INVENTION

1. Field of the Invention

The present invention relates to piezoelectric devices.

2. Description of the Related Art

U.S. Patent Application Publication No. 2019/0110132 discloses a configuration of a piezoelectric device. The piezoelectric device described in U.S. Patent Application Publication No. 2019/0110132 includes a plurality of plates and a plurality of springs. Each of the plurality of springs connects two adjacent plates to each other. Each of the plurality of springs includes a first spring arm and a second spring arm that interpose a gap between two adjacent plates therebetween. Each of the first spring arm and the second spring arm includes portions surrounding etched portions of the plate.

In the piezoelectric device disclosed in U.S. Patent Application Publication No. 2019/0110132, a root portion of the spring is disposed at a tip opposite to a fixed end side of the plate, which is a beam section. Since stress concentration occurs at the root portion of the spring, when the springs are disposed at two end edges intersecting each other at the tips of the plates and the root portions of the two springs are close to each other, there is a possibility that a crack occurs between the root portions and excitation characteristics deteriorate.

SUMMARY OF THE INVENTION

Preferred embodiments of the present invention provide piezoelectric devices that are each able to reduce or prevent deterioration of excitation characteristics by separating stress concentration portions from each other in a plurality of beam sections.

A piezoelectric device according to a preferred embodiment of the present invention includes a base having an annular shape, a plurality of beam sections, and a connecting section. Each of the plurality of beam sections includes a fixed end portion connected to the base and a tip end portion located on a side opposite to the fixed end portion and extends from the fixed end portion toward the tip end portion. The connecting section connects, among the beam sections, a pair of beam sections adjacent to each other in a circumferential direction of the base. Each of the beam sections is a piezoelectric vibrating section including layers. A slit and an opening are provided between the pair of beam sections. The slit is defined by portions of a pair of end edges adjacent to each other of the pair of beam sections. The opening is located adjacent to the tip end portions of the pair of beam sections while being spaced apart from the slit and is defined by other portions of the pair of end edges. The connecting section is provided to fold back between the pair of beam sections. The connecting section includes a first coupling portion, a second coupling portion, and a bridging portion. The first coupling portion extends along the slit and is connected to one of the pair of beam sections. The second coupling portion extends along the slit and is connected to another of the pair of beam sections. The bridging portion is located between the slit and the opening and is connected to both of the first coupling portion and the second coupling portion. The beam sections are connected to each other in the circumferential direction via the connecting section while each of the beam sections is interposed between slits extending in intersecting directions.

According to preferred embodiments of the present invention, deterioration of the excitation characteristics of the piezoelectric device is able to be reduced or prevented by separating the stress concentration portions from each other in each of the beam sections.

The above and other elements, features, steps, characteristics and advantages of the present invention will become more apparent from the following detailed description of the present preferred embodiments with reference to the attached drawings.

DETAILED DESCRIPTION OF THE PRESENT PREFERRED EMBODIMENTS

Figure 1:
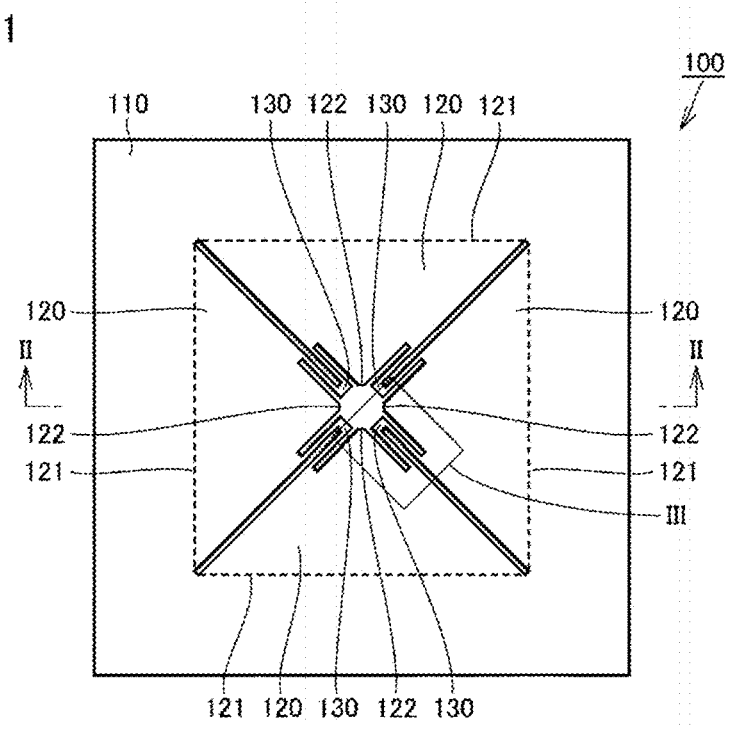
FIG. 1 is a plan view of a piezoelectric device according to Preferred Embodiment 1 of the present invention.

Hereinafter, piezoelectric devices according to preferred embodiments of the present invention will be described with reference to the drawings. In the following description of the present preferred embodiments, the same or equivalent portions in the drawings are denoted by the same reference signs, and description thereof will not be repeated.

Preferred Embodiment 1

Figure 2:
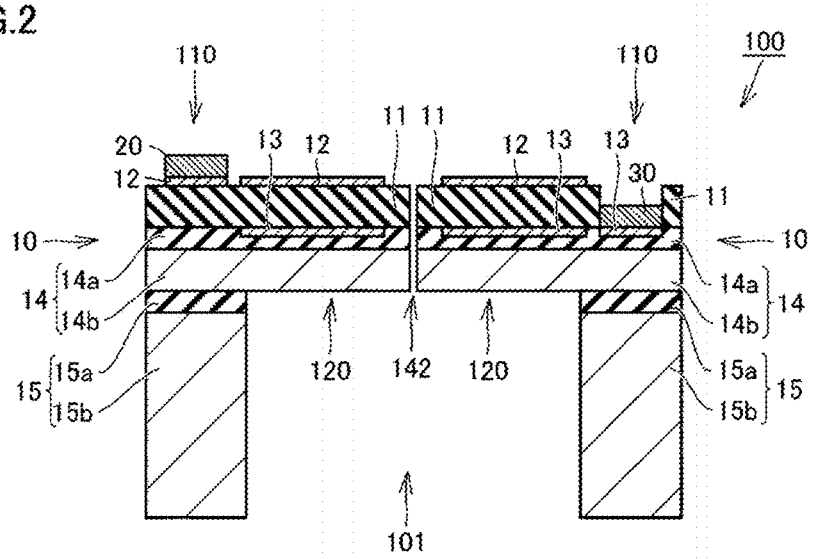
FIG. 2 is a sectional view of the piezoelectric device illustrated in FIG. 1 taken along line II-II.
Figure 3:
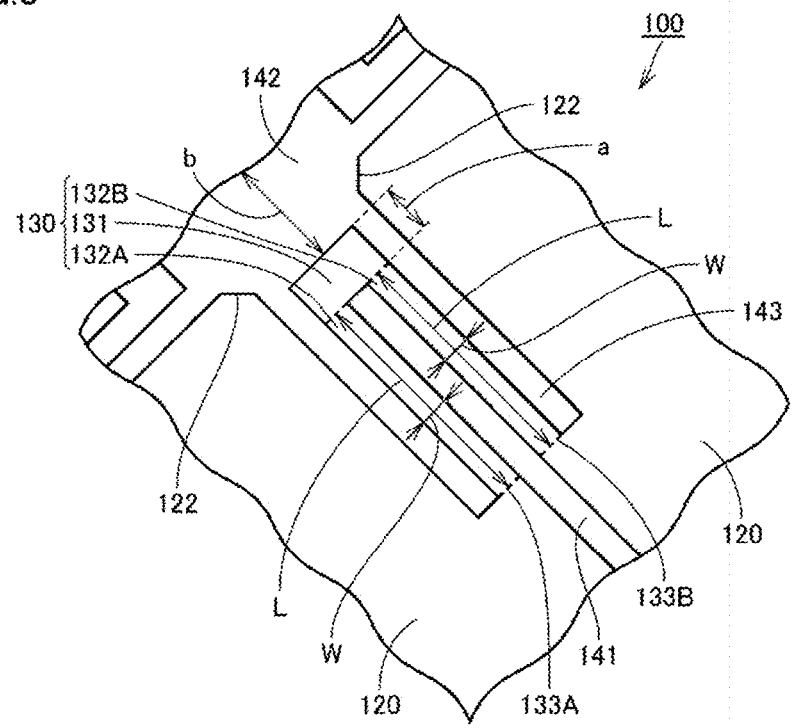
FIG. 3 is an enlarged partial plan view of part III in FIG. 1.

FIG. 1 is a plan view of a piezoelectric device according to Preferred Embodiment 1 of the present invention. FIG. 2 is a sectional view of the piezoelectric device illustrated in FIG. 1 taken along line II-II. FIG. 3 is an enlarged partial plan view of part III in FIG. 1.

As illustrated in FIGS. 1 to 3, a piezoelectric device 100 according to Preferred Embodiment 1 of the present invention preferably includes a base 110 having an annular shape, a plurality of beam sections 120, and a plurality of connecting sections 130. The piezoelectric device 100 according to the present preferred embodiment can be used as an ultrasonic transducer because each of the plurality of beam sections 120 is capable of flexural vibration.

As illustrated in FIG. 1, the piezoelectric device 100 according to Preferred Embodiment 1 of the present invention preferably includes four beam sections 120 as the plurality of beam sections 120 and four connecting sections 130 as the plurality of connecting sections 130. The four beam sections 120 are each located along the same or substantially the same plane. The four beam sections 120 each extend toward the center of the base 110 having the annular shape and are adjacent to each other in a circumferential direction of the base 110. Each of the four connecting sections 130 is located between the beam sections 120 adjacent to each other among the four beam sections 120 and connects the pair of beam sections 120 adjacent to each other.

In the present preferred embodiment, the four beam sections 120 are configured to be rotationally symmetric around the center of the base 110. The four connecting sections 130 are also configured to be rotationally symmetric around the center of the base 110.

The base 110 is connected to fixed end portions 121 of the plurality of beam sections 120. When viewed from a laminating direction of a plurality of layers described later, the base 110 preferably has the annular shape and specifically has a rectangular or substantially rectangular annular shape, for example. The shape of the base 110 when viewed from the laminating direction is not limited as long as the shape is annular. The base 110 may have, for example, a polygonal, substantially polygonal, circular, or substantially circular outer peripheral side surface and a polygonal, substantially polygonal, circular, or circular inner peripheral side surface when viewed from the laminating direction.

As illustrated in FIG. 2, each of the plurality of beam sections 120 is a piezoelectric vibrating section including a plurality of layers 10. In FIG. 1, individual layers of the plurality of layers 10 are not illustrated. The configuration of the plurality of layers 10 will be described in detail later.

As illustrated in FIG. 1, each of the plurality of beam sections 120 includes the fixed end portion 121 and a tip end portion 122. The fixed end portion 121 is connected to the base 110. The fixed end portions 121 of the plurality of beam sections 120 are each located in the same virtual plane. The fixed end portions 121 of the plurality of beam sections 120 are each connected to an inner peripheral surface of the annular base 110 when viewed from the laminating direction. The fixed end portions 121 of the plurality of beam sections 120 are each located adjacent to each other on the inner peripheral surface when viewed from the laminating direction. In the present preferred embodiment, the fixed end portions 121 of the plurality of beam sections 120 are located in one-to-one correspondence with a plurality of sides of the rectangular annular inner peripheral surface of the base 110, respectively, when viewed from the laminating direction.

In the present preferred embodiment, the tip end portions 122 of the plurality of beam sections 120 are each located in the vicinity of the center of the base 110 having the annular shape when viewed from the laminating direction. Each of the plurality of beam sections 120 extends from the fixed end portion 121 toward the tip end portion 122. That is, in an extending direction of each of the plurality of beam sections 120, the tip end portion 122 is located at an end portion opposite to the fixed end portion 121. In the present preferred embodiment, the plurality of beam sections 120 each extends along the same virtual plane when the piezoelectric device 100 is not driven.

As illustrated in FIG. 1, each of the plurality of beam sections 120 has a tapered outer shape when viewed from the laminating direction. Specifically, each of the plurality of beam sections 120 has a substantially triangular outer shape when viewed from the laminating direction. The extending direction of each of the plurality of beam sections 120 is a direction connecting the center of the fixed end portion 121 and the tip end portion 122.

In the present preferred embodiment, the length of each of the plurality of beam sections 120 in the extending direction is preferably at least five times or more a dimension of the thickness of each of the plurality of beam sections 120 in the laminating direction from the viewpoint of facilitating flexural vibration. In FIG. 2, the thickness of each of the plurality of beam sections 120 is schematically illustrated.

As illustrated in FIGS. 1 and 3, a slit 141 and an opening 142 are provided between the pair of beam sections 120 adjacent to each other in the circumferential direction of the base 110 among the plurality of beam sections 120. In the present preferred embodiment, outer peripheral slits 143 are further provided.

The slit 141 is defined by portions of a pair of end edges adjacent to each other of the pair of beam sections 120. When viewed from the laminating direction, the slit 141 is located along two sides of the beam sections 120 having a triangular or substantially triangular outer shape. Each of the two sides extends from the fixed end portion 121 toward the tip end portion 122.

The opening 142 is located adjacent to the tip end portions 122 of the pair of the beam sections 120 while being spaced apart from the slit 141, and is defined by other portions of the pair of end edges adjacent to each other of the pair of beam sections 120. When viewed from the laminating direction, the opening 142 is located on an extension line of the slit 141. When viewed from the laminating direction, the opening 142 is located on the center of the base 110 having the annular shape.

The outer peripheral slit 143 extends along both of a first coupling portion 132A and a second coupling portion 132B, which will be described later, at a distance from the slit 141 and communicates with the opening 142. Specifically, the outer peripheral slit 143 includes two slits extending in parallel with each other with the connecting section 130 interposed therebetween.

A width of each of the slit 141 and the outer peripheral slit 143 when viewed from the laminating direction is preferably about 10 μm or less, and more preferably about 1 μm or less, for example.

As illustrated in FIGS. 1 and 3, the connecting section 130 connects the pair of beam sections 120 adjacent to each other in the circumferential direction of the base 110 among the plurality of beam sections 120. The connecting section 130 is provided so as to fold back between the pair of beam sections 120.

The connecting section 130 includes a first end portion 133A and a second end portion 133B. The connecting section 130 is connected to one of the pair of beam sections 120 at the first end portion 133A. The connecting section 130 is connected to another of the pair of beam sections 120 at the second end portion 133B. The second end portion 133B is aligned with the first end portion 133A with a gap in a direction in which the pair of beam sections 120 are aligned. In the present preferred embodiment, the connecting section 130 preferably includes only one first end portion 133A and only one second end portion 133B.

To be specific, the connecting section 130 includes the first coupling portion 132A, the second coupling portion 132B, and a bridging portion 131. The first coupling portion 132A extends along the slit 141 and is connected to the one of the pair of beam sections 120. The second coupling portion 132B extends along the slit 141 and is connected to the other of the pair of beam sections 120.

The bridging portion 131 is located between the slit 141 and the opening 142 and is connected to both of the first coupling portion 132A and the second coupling portion 132B. The bridging portion 131 extends along a direction in which the first coupling portion 132A and the second coupling portion 132B adjacent to each other are aligned.

The first coupling portion 132A is connected to a portion of the bridging portion 131 located on the side of the one of the pair of beam sections 120. The second coupling portion 132B is connected to a portion of the bridging portion 131 located on the side of the other of the pair of beam sections 120.

In the present preferred embodiment, when viewed from the laminating direction, each of the bridging portion 131, the first coupling portion 132A, and the second coupling portion 132B has a rectangular or substantially rectangular outer shape, for example. However, the outer shape of each of the bridging portion 131, the first coupling portion 132A, and the second coupling portion 132B is not limited to a specific shape. When viewed from the laminating direction, the outer shape of each of the first coupling portion 132A and the second coupling portion 132B may be an elliptical or substantially an elliptical shape or a polygonal or substantially polygonal shape. In each of the bridging portion 131, the first coupling portion 132A, and the second coupling portion 132B, a side surface extending in the laminating direction may be curved when viewed from the laminating direction.

As illustrated in FIG. 3, in the present preferred embodiment, dimensions of lengths L of the first coupling portion 132A and the second coupling portion 132B are preferably equal or substantially equal to each other. The dimensions of minimum widths W of the first coupling portion 132A and the second coupling portion 132B are equal substantially equal to each other. The dimensions of the lengths L of the first coupling portion 132A and the second coupling portion 132B are preferably larger than the dimensions of the minimum widths W of the first coupling portion 132A and the second coupling portion 132B. The dimensions of the lengths L of the first coupling portion 132A and the second coupling portion 132B are preferably larger than the dimension of shortest length b from the bridging portion 131 to the center of the base 110. The dimensions of the lengths L of the first coupling portion 132A and the second coupling portion 132B are preferably larger than the dimension of a maximum width a of the bridging portion 131. The dimension of the maximum width a of the bridging portion 131 is preferably larger than the dimensions of the minimum widths W of the first coupling portion 132A and the second coupling portion 132B.

The smaller the dimensions of the lengths L of the first coupling portion 132A and the second coupling portion 132B, the more firmly the pair of beam sections 120 are connected to each other and the smaller the vibration variation of the pair of beam sections 120. The larger the dimensions of the lengths L of the first coupling portion 132A and the second coupling portion 132B, the lower the resonant frequencies of the vibrations of the pair of beam sections 120 can be. The larger the dimensions of the minimum widths W of the first coupling portion 132A and the second coupling portion 132B, the more firmly the pair of beam sections 120 are connected to each other. The smaller the dimension of the shortest length b from the bridging portion 131 to the center of the base 110, the more firmly the pair of beam sections 120 are connected to each other and the less air passes through the opening 142 during excitation of the piezoelectric device 100. Thus, the loss of the piezoelectric device 100 can be reduced. The dimension of the maximum width a of the bridging portion 131 affects the resonant frequency of the connecting section 130 when the connecting section 130 vibrates.

In the present preferred embodiment, the dimensions of the lengths L of the first coupling portion 132A and the second coupling portion 132B are preferably, for example, about 10 μm or more and about 200 μm or less. The dimensions of the minimum widths W of the first coupling portion 132A and the second coupling portion 132B are preferably, for example, about 10 μm. The dimension of the shortest length b from the bridging portion 131 to the center of the base 110 is preferably, for example, about 25 μm. The dimension of the maximum width a of the bridging portion 131 is preferably, for example, about 15 μm.

Here, a piezoelectric device according to a first modification of Preferred Embodiment 1 of the present invention having a different shape of connecting section will be described.

Figure 4:
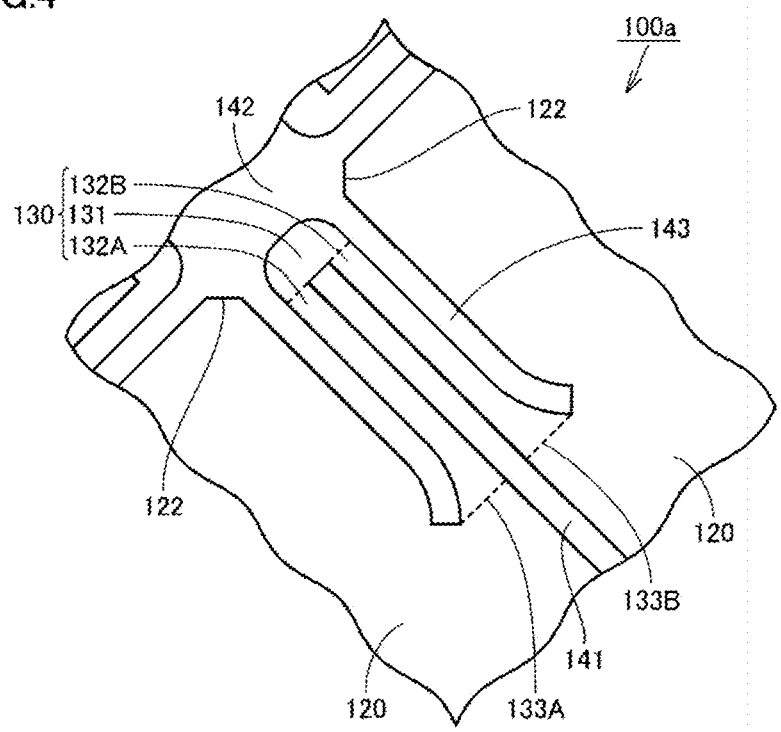
FIG. 4 is a partial plan view of a piezoelectric device according to a first modification of Preferred Embodiment 1 of the present invention.

FIG. 4 is a partial plan view of the piezoelectric device according to the first modification of Preferred Embodiment 1 of the present invention. FIG. 4 illustrates a portion similar to the portion of the piezoelectric device 100 according to Preferred Embodiment 1 of the present invention illustrated in FIG. 3.

As illustrated in FIG. 4, in a piezoelectric device 100a according to the first modification of Preferred Embodiment 1 of the present invention, a side surface of the bridging portion 131 in contact with the opening 142 is curved. This curvature of the side surface of the bridging portion 131 can reduce internal stress in the connecting section 130.

In the piezoelectric device 100a, the end portions of the outer peripheral slit 143 opposite to the opening 142 side are curved away from each other so that the width of the first coupling portion 132A becomes wider toward the first end portion 133A, and the width of the second coupling portion 132B becomes wider toward the second end portion 133B.

Next, the plurality of layers 10 will be described. As illustrated in FIG. 2, in the present preferred embodiment, the plurality of layers 10 includes a piezoelectric layer 11, a first electrode layer 12, and a second electrode layer 13.

The piezoelectric layer 11 is made of a single crystal piezoelectric material. A cut orientation of the piezoelectric layer 11 is appropriately selected so as to exhibit desired device characteristics. In the present preferred embodiment, the piezoelectric layer 11 is a thinned single crystal substrate, and the single crystal substrate is specifically a rotated Y-cut substrate. The cut orientation of the rotated Y-cut substrate is specifically, for example, about 30°. The thickness of the piezoelectric layer 11 is preferably, for example, about 0.3 μm or more and about 5.0 μm or less. The single crystal piezoelectric material has a polarization axis. An axial direction of the polarization axis will be described in detail later.

The material defining the piezoelectric layer 11 is appropriately selected so that the piezoelectric device 100 exhibits desired device characteristics. In the present preferred embodiment, the piezoelectric layer 11 is made of an inorganic material. Specifically, the piezoelectric layer 11 is made of an alkali niobate-based compound or an alkali tantalate-based compound. In the present preferred embodiment, for example, the alkali metal included in the alkali niobate-based compound or the alkali tantalate-based compound is at least one of lithium, sodium, and potassium. In the present preferred embodiment, the piezoelectric layer 11 is made of, for example, lithium niobate ($LiNbO_3$) or lithium tantalate ($LiTaO_3$).

As illustrated in FIG. 2, the first electrode layer 12 is on one side of the piezoelectric layer 11 in the laminating direction of the plurality of layers 10. The second electrode layer 13 is on the other side of the piezoelectric layer 11 so as to oppose at least a portion of the first electrode layer 12 with the piezoelectric layer 11 in between.

In the present preferred embodiment, adhesion layers (not illustrated) are between the first electrode layer 12 and the piezoelectric layer 11, between the second electrode layer 13 and the piezoelectric layer 11, and between the second electrode layer 13 and the piezoelectric layer 11, respectively. In each of the plurality of beam sections 120, both the first electrode layer 12 and the second electrode layer 13 are provided so as not to oppose all the slit 141, the opening 142, and the outer peripheral slit 143.

In the present preferred embodiment, each of the first electrode layer 12 and the second electrode layer 13 is made of Pt, for example. Each of the first electrode layer 12 and the second electrode layer 13 may be made of another material such as Al, for example. The adhesion layer is made of Ti, for example. The adhesion layer may be made of another material such as NiCr. Each of the first electrode layer 12, the second electrode layer 13, and the adhesion layer may be an epitaxial growth film. When the piezoelectric layer 11 is made of lithium niobate ($LiNbO_3$), the adhesion layer is preferably made of, for example, NiCr from the viewpoint of reducing or preventing diffusion of the material defining the adhesion layer into the first electrode layer 12 or the second electrode layer 13. Accordingly, reliability of the piezoelectric device 100 is improved.

In the present preferred embodiment, the thickness of each of the first electrode layer 12 and the second electrode layer 13 is preferably, for example, about 0.05 μm or more and about 0.2 μm or less. The thickness of the adhesion layer is, for example, about 0.005 μm or more and about 0.05 μm or less.

The plurality of layers 10 further includes a support layer 14. The support layer 14 is on the side opposite to the first electrode layer 12 side of the piezoelectric layer 11 and on the side opposite to the piezoelectric layer 11 side of the second electrode layer 13. The support layer 14 preferably includes a first support portion 14a and a second support portion 14b laminated on the first support portion 14a on the side opposite to the piezoelectric layer 11 side. In the present preferred embodiment, the first support portion 14a is made of, for example, SiO$_2$, and the second support portion 14*b* is made of, for example, single crystal Si. In the present preferred embodiment, the thickness of the support layer 14 is preferably thicker than that of the piezoelectric layer 11 from the viewpoint of the flexural vibration of the plurality of beam sections 120. The mechanism of the flexural vibration of the plurality of beam sections 120 will be described later.

Further, as illustrated in FIG. 2, in the present preferred embodiment, the connecting section 130 is configured such that the plurality of layers 10 defining each of the of beam sections 120 is continuous in a direction orthogonal or substantially orthogonal to the laminating direction. However, in the present preferred embodiment, the plurality of layers 10 in the connecting section 130 does not include the first electrode layer 12 and the second electrode layer 13.

Further, structures defining the base 110 will be described. As illustrated in FIG. 2, in the present preferred embodiment, the base 110 includes the plurality of layers 10 the same as or similar to those included in the plurality of beam sections 120. The plurality of layers 10 of the base 110 is configured to be continuous with the plurality of layers 10 of each of the plurality of beam sections 120. Specifically, the piezoelectric layer 11, the first electrode layer 12, the second electrode layer 13, and the support layer 14 defining the base 110 are configured to be continuous with the piezoelectric layers 11, the first electrode layers 12, the second electrode layers 13, and the support layers 14 defining the plurality of beam sections 120, respectively. The base 110 further includes a substrate layer 15, a first connection electrode layer 20, and a second connection electrode layer 30.

The substrate layer 15 is connected to the support layer 14 on the side opposite to the piezoelectric layer 11 side in the axial direction of the central axis of the base 110 having the annular shape. The substrate layer 15 includes a first substrate layer 15*a* and a second substrate layer 15*b* laminated on the first substrate layer 15*a* on the side opposite to the support layer 14 side in the axial direction of the central axis. In the present preferred embodiment, the first substrate layer 15*a* is made of, for example, SiO$_2$, and the second substrate layer 15*b* is preferably made of, for example, single crystal Si.

As illustrated in FIG. 2, the first connection electrode layer 20 is exposed to the outside while being electrically connected to the first electrode layer 12 with an adhesion layer (not illustrated) interposed therebetween. Specifically, the first connection electrode layer 20 is disposed on the side opposite to the support layer 14 side of the second electrode layer 13 in the base 110.

The thickness of each of the first connection electrode layer 20 and the second connection electrode layer 30 is preferably, for example, about 0.1 μm or more and about 1.0 μm or less. The thickness of each of the adhesion layer connected to the first connection electrode layer 20 and the adhesion layer connected to the second connection electrode layer 30 is preferably, for example, about 0.005 μm or more and about 0.1 μm or less.

In the present preferred embodiment, each of the first connection electrode layer 20 and the second connection electrode layer 30 is made of, for example, Au. The first connection electrode layer 20 and the second connection electrode layer 30 may be made of another conductive material such as, for example, Al. Each of the adhesion layer connected to the first connection electrode layer 20 and the adhesion layer connected to the second connection electrode layer 30 is made of, for example, Ti. These adhesion layers may be made of NiCr, for example.

As illustrated in FIG. 2, the piezoelectric device 100 according to the present preferred embodiment includes a hole 101, which opens on the side opposite to the piezoelectric layer 11 side in the laminating direction. In the present preferred embodiment, the hole 101 is a space surrounded by the base 110, the plurality of beam sections 120, the plurality of connecting sections 130, the plurality of slits 141, the opening 142, and the plurality of outer peripheral slits 143.

Here, the axial direction of the polarization axis of the single crystal piezoelectric material defining the piezoelectric layer 11 will be described. It is preferable that an axial direction of a virtual axis when the polarization axis of the single crystal piezoelectric material is projected from the laminating direction onto a virtual plane orthogonal or substantially orthogonal to the laminating direction extend in the same direction in all of the plurality of beam sections 120, and an angle between the axial direction of the virtual axis and an extending direction of each of the plurality of slits 141 is not about 45 degrees or about 135 degrees when viewed from the laminating direction.

More specifically, in the present preferred embodiment, it is more preferable that the angle between the axial direction of the virtual axis and the extending direction of each of the plurality of slits 141 is, for example, about 0 degrees or more and about 5 degrees or less, about 85 degrees or more and about 95 degrees or less, or about 175 degrees or more and less than about 180 degrees when viewed from the laminating direction.

In addition, it is more preferable that the angle between the extending direction of each of the plurality of beam sections 120 and the axial direction of the virtual axis when viewed from the laminating direction is, for example, about 40 degrees or more and about 50 degrees or less, or about 130 degrees or more and about 140 degrees or less. It is preferable that the axial direction of the virtual axis in the piezoelectric device 100 according to the present preferred embodiment satisfy the above relationships for all the slits 141 and the bridging portions 131. The reason for having a suitable range for each angle involved in the virtual axis will be described later.

In the present preferred embodiment, the axial direction of the virtual axis is oriented in a specific direction, but the axial direction of the virtual axis is not limited to a specific direction.

In addition, in the present preferred embodiment, since the single crystal piezoelectric material has the polarization axis, thermal stress generated in the plurality of beam sections 120 may cause each of the plurality of beam sections 120 to warp when viewed from the direction orthogonal or substantially orthogonal to the laminating direction. Modifications in which each of the plurality of beam sections 120 is warped will be described below.

Figure 5:
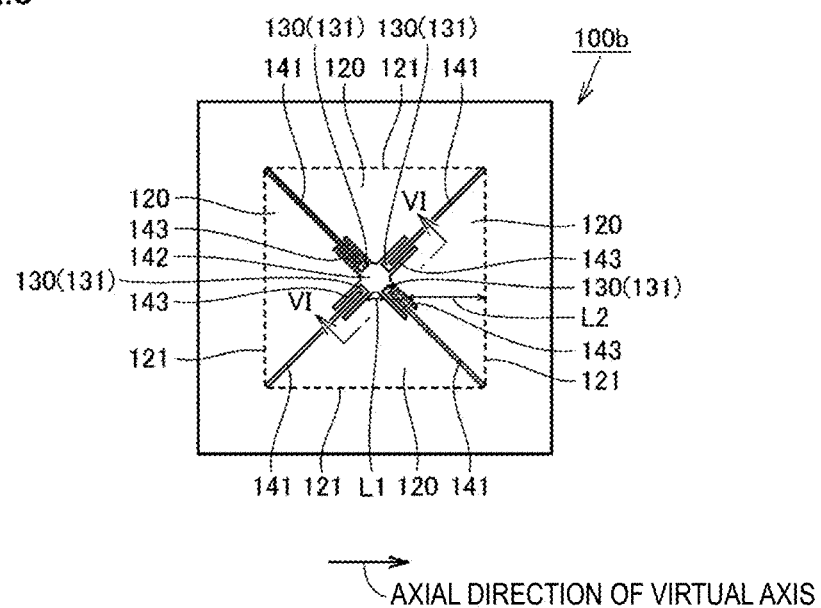
FIG. 5 is a plan view of a piezoelectric device according to a second modification of Preferred Embodiment 1 of the present invention.
Figure 6:
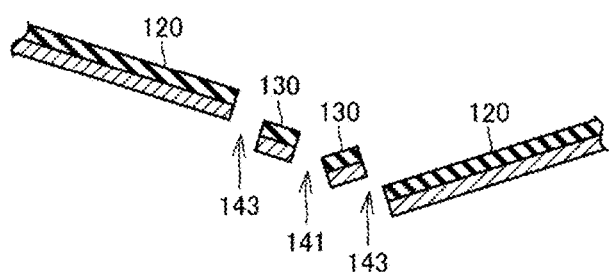
FIG. 6 is a partial sectional view of the piezoelectric device illustrated in FIG. 5 taken along line VI-VI.

FIG. 5 is a plan view of a piezoelectric device according to a second modification of Preferred Embodiment 1 of the present invention. FIG. 6 is a partial sectional view of the piezoelectric device illustrated in FIG. 5 taken along line VI-VI.

As illustrated in FIG. 5, in a piezoelectric device 100*b* according to the second modification of Preferred Embodiment 1 of the present invention, the angle between the axial direction of the virtual axis and each of the plurality of slits 141 is preferably, for example, about 45 degrees when viewed from the laminating direction.

Thus, in the modification, a distance L1 from the center of the connecting section 130 to an opposite end portion of one beam section 120 of the pair of beam sections 120 and a distance L2 from the center of the connecting section 130 to an opposite end portion of another beam section 120 of the pair of beam sections 120 in the axial direction of the virtual axis when viewed from the laminating direction are different from each other. In addition, the end portion of the one beam section 120 of the pair of beam sections 120 located on the side opposite to the side of the center of the connecting section 130 in the axial direction of the virtual axis when viewed from the laminating direction is not the fixed end portion 121. On the other hand, the end portion of the other beam section 120 located on the side opposite to the side of the center of the connecting section 130 in the axial direction of the virtual axis when viewed from the laminating direction, in the axial direction of the virtual axis when viewed from the laminating direction is the fixed end portion 121. Thus, when thermal stress is applied to the plurality of beam sections 120, the pair of beam sections 120 warp in different modes in the vicinity of the connecting section 130.

In the piezoelectric device 100b according to the modification, the above-described thermal stress is applied to the plurality of beam sections 120. As a result, as illustrated in FIG. 6, when the piezoelectric device 100b is not driven, end portions of the pair of beam sections 120 in the vicinity of the center of the connecting section 130 are located at positions different from each other in the laminating direction.

Figure 7:
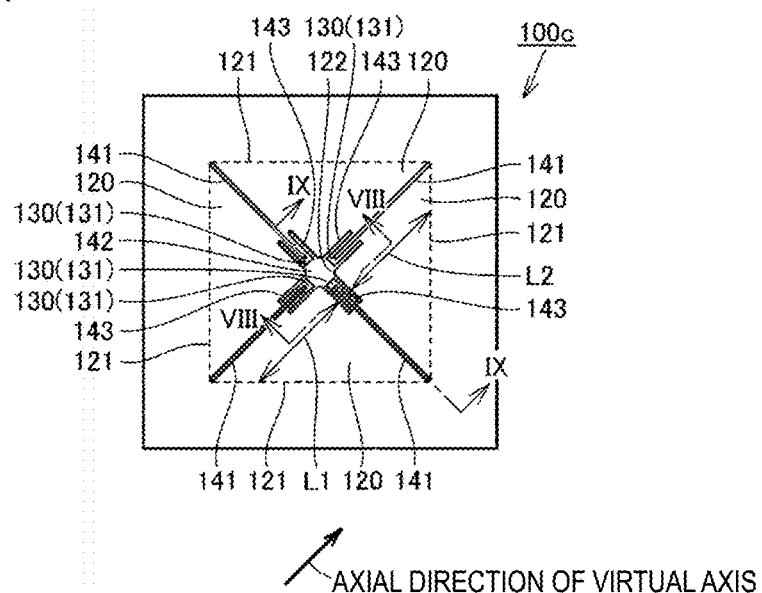
FIG. 7 is a plan view of a piezoelectric device according to a third modification of Preferred Embodiment 1 of the present invention.
Figure 8:
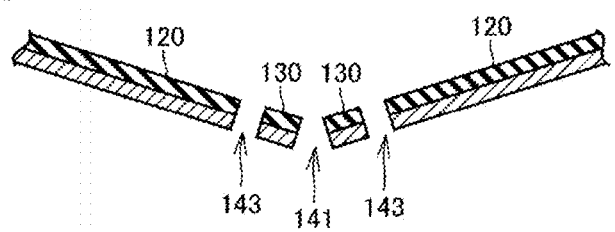
FIG. 8 is a partial sectional view of the piezoelectric device illustrated in FIG. 7 taken along line VIII-VIII.
Figure 9:
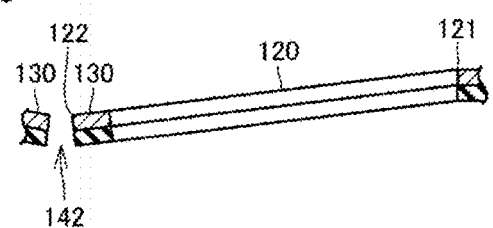
FIG. 9 is a partial sectional view of the piezoelectric device illustrated in FIG. 7 taken along line IX-IX.

FIG. 7 is a plan view of a piezoelectric device according to a third modification of Preferred Embodiment 1 of the present invention. FIG. 8 is a partial sectional view of the piezoelectric device illustrated in FIG. 7 taken along line VIII-VIII. FIG. 9 is a partial sectional view of the piezoelectric device illustrated in FIG. 7 taken along line IX-IX.

As illustrated in FIG. 7, in a piezoelectric device 100c according to the third modification of Preferred Embodiment 1 of the present invention, the angle between the axial direction of the virtual axis of the single crystal piezoelectric material and each of the plurality of slits 141 is preferably, for example, about 0 degrees or about 90 degrees when viewed from the laminating direction.

Thus, in the modification, a distance L1 from the center of the connecting section 130 to an opposite end portion of one beam section 120 of the pair of beam sections 120 and a distance L2 from the center of the connecting section 130 to an opposite end portion of another beam section 120 of the pair of beam sections 120 in the axial direction of the virtual axis when viewed from the laminating direction are equal to each other. In addition, in the axial direction of the virtual axis when viewed from the laminating direction, a distance from an end portion in the vicinity of the center of the connecting section 130 to the fixed end portion 121 in the one beam section 120 of the pair of beam sections 120 is equal to a distance from an end portion in the vicinity of the center of the connecting section 130 to the fixed end portion 121 in the other beam section 120.

Further, in the piezoelectric device 100c according to the modification, each of the plurality of beam sections 120 is warped due to thermal stress applied to the plurality of beam sections 120. As a result, as illustrated in FIG. 8, when the piezoelectric device 100c is not driven, the end portions of the pair of beam sections 120 in the vicinity of the center of the connecting section 130 on the side of the center of the connecting section 130 are located at the same or substantially the same position in the laminating direction. As described above, in the modification, even when each of the plurality of beam sections 120 is warped due to thermal stress, it is possible to reduce or prevent damage at the connecting section 130, particularly, the bridging portion 131.

As described above, by comparing the piezoelectric device 100b according to the second modification with the piezoelectric device 100c according to the third modification of Preferred Embodiment 1 of the present invention, the following can be seen. When viewed from the laminating direction, the closer the angle between the axial direction of the virtual axis and the extending direction of each of the plurality of slits 141 approaches 0 degrees or 90 degrees from the state in which the angle is 45 degrees or 135 degrees, the more the difference in displacement of the pair of beam sections 120 due to thermal stress can be reduced or prevented.

As illustrated in FIG. 9, in the piezoelectric device 100c according to the third modification of Preferred Embodiment 1 of the present invention, when both of the pair of beam sections 120 are viewed from the slit 141 side, both of the pair of beam sections 120 are inclined toward one side in the laminating direction.

In the piezoelectric device 100 according to Preferred Embodiment 1 of the present invention, each of the plurality of beam sections 120 is configured to be capable of flexural vibration. Here, the mechanism of the flexural vibration of the plurality of beam sections 120 will be described.

Figure 10:
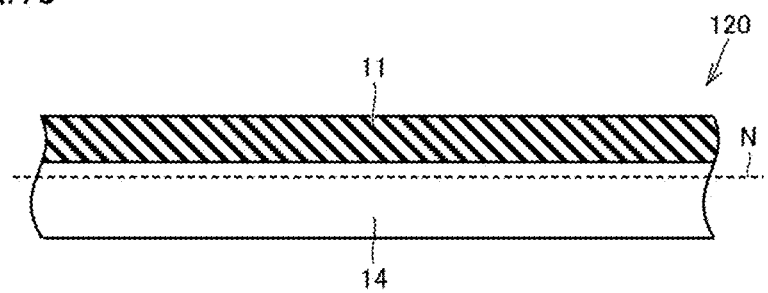
FIG. 10 is a sectional view schematically illustrating a portion of a beam section of the piezoelectric device according to Preferred Embodiment 1 of the present invention.
Figure 11:
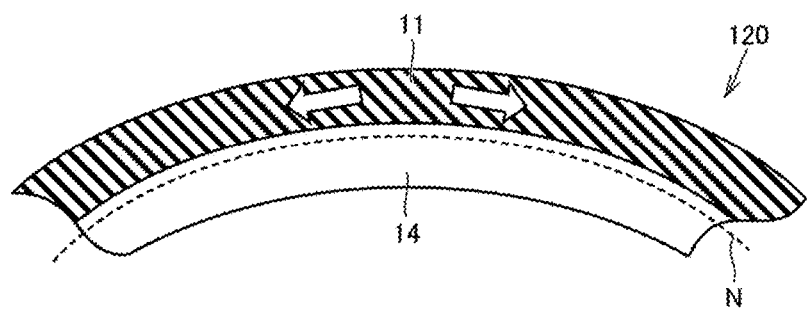
FIG. 11 is a sectional view schematically illustrating a portion of the beam section of the piezoelectric device according to Preferred Embodiment 1 of the present invention during driving.

FIG. 10 is a sectional view schematically illustrating part of the beam section of the piezoelectric device according to Preferred Embodiment 1 of the present invention. FIG. 11 is a sectional view schematically illustrating a portion of the beam section of the piezoelectric device according to Preferred Embodiment 1 of the present invention during driving. In FIGS. 10 and 11, the first electrode layer and the second electrode layer are not illustrated.

As illustrated in FIGS. 10 and 11, in the present preferred embodiment, in the plurality of beam sections 120, the piezoelectric layer 11 defines and functions as an elastic layer that is stretchable in an in-plane direction orthogonal or substantially orthogonal to the laminating direction, and the layers other than the piezoelectric layer 11 define and function as a constraining layer. In the present preferred embodiment, the support layer 14 defines and functions as a main portion of the constraining layer. In this manner, the constraining layer is laminated on the elastic layer in a direction orthogonal or substantially orthogonal to an extending/contracting direction of the elastic layer. Each of the plurality of beam sections 120 may include, instead of the constraining layer, a reverse-direction elastic layer that can contract in the in-plane direction when the elastic layer expands in the in-plane direction and can expand in the in-plane direction when the elastic layer contracts in the in-plane direction.

When the piezoelectric layer 11, which is the elastic layer, expands and contracts in the in-plane direction, the support layer 14, which is the main portion of the constraining layer, constrains the expansion and contraction of the piezoelectric layer 11 at a bonding surface with the piezoelectric layer 11. In addition, in the present preferred embodiment, in each of the plurality of beam sections 120, the piezoelectric layer 11, which is the elastic layer, is located only on one side of a stress neutral plane N of each of the plurality of beam sections 120. The position of the center of gravity of the support layer 14, which is the main portion of the constraining layer, is located on another side of the stress neutral plane N. As a result, as illustrated in FIGS. 10 and 11, when the piezoelectric layer 11, which is the elastic layer, expands and contracts in the in-plane direction, each of the plurality of beam sections 120 bends in a direction orthogonal or substantially orthogonal to the in-plane direction. The longer the separation distance between the stress neutral plane N and the piezoelectric layer 11, the larger the amount of displacement of each of the plurality of beam sections 120 when each of the plurality of beam sections 120 bends. In addition, the larger the stress for expanding and contracting the piezoelectric layer 11, the larger the amount of the displacement. In this manner, each of the plurality of beam sections 120 flexuously vibrates with the fixed end portion 121 as a starting point in the direction orthogonal or substantially orthogonal to the in-plane direction.

Further, in the piezoelectric device 100 according to the present preferred embodiment, by providing the connecting section 130, vibration in a fundamental mode of vibration is easily generated, and generation of vibration in a coupled vibration mode is reduced or prevented. The fundamental mode of vibration is a mode in which phases of flexural vibrations of the plurality of beam sections 120 are synchronized, and the entire or substantially the entire plurality of beam sections 120 is simultaneously displaced to either upward or downward. On the other hand, the coupled vibration mode is a mode in which the phase of at least one of the plurality of beam sections 120 is not synchronized with the phase of the other beam sections 120 when the plurality of beam sections 120 each flexuously vibrates.

Figure 12:
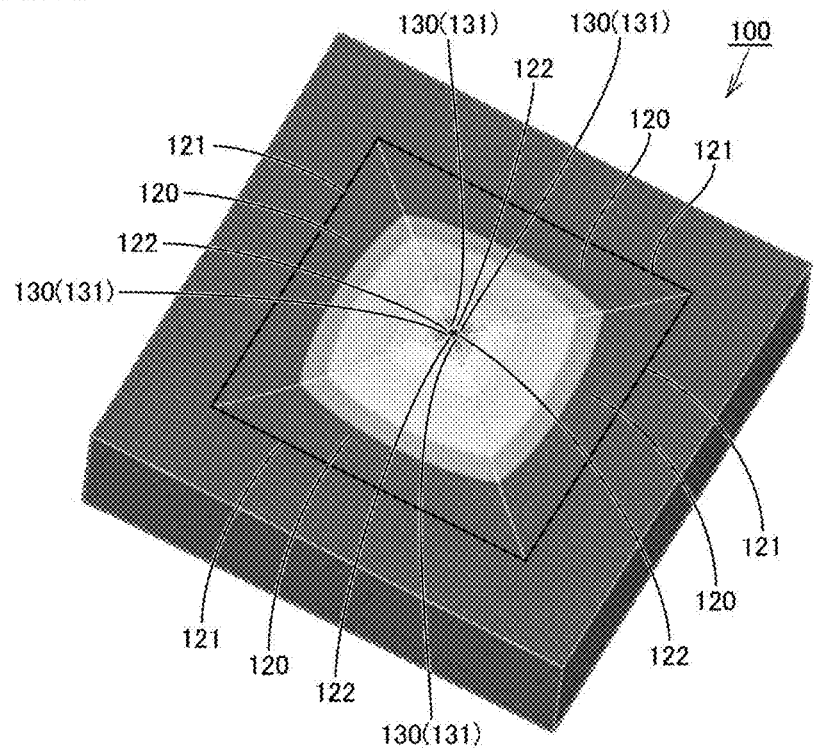
FIG. 12 is a perspective view illustrating a state in which the piezoelectric device according to Preferred Embodiment 1 of the present invention vibrates in a fundamental mode of vibration by simulation.

FIG. 12 is a perspective view illustrating a state in which the piezoelectric device according to Preferred Embodiment 1 of the present invention vibrates in the fundamental mode of vibration by simulation. Specifically, FIG. 12 illustrates the piezoelectric device 100 in which each of the plurality of beam sections 120 is displaced to the side of the first electrode layer 12. Further, in FIG. 12, the larger the amount of displacement of each of the plurality of beam sections 120 displaced to the side of the first electrode layer 12, the lighter the color of each of the plurality of beam sections 120. In FIG. 12, the individual layers defining the plurality of layers 10 are not illustrated.

As illustrated in FIG. 12, for each of the plurality of beam sections 120, the pair of beam sections 120 adjacent to each other are connected to each other by the connecting section 130, so that the generation of the coupled vibration mode is reduced or prevented.

Further, in the connecting section 130 of the piezoelectric device 100 according to the present preferred embodiment, the first end portion 133A and the second end portion 133B are each located closer to the tip end portions 122 than to the fixed end portions 121 of the pair of beam sections 120. This allows the plurality of beam sections 120 to be connected relatively strongly to each other, so that the phases of the vibrations of the plurality of beam sections 120 are more easily synchronized. In addition, the connecting section 130 of the piezoelectric device 100 according to the present preferred embodiment includes the bridging portion 131. The connecting section 130 connects the pair of beam sections 120 while folding back between the pair of beam sections 120. Thus, when the plurality of beam sections 120 vibrates, the first coupling portion 132A and the second coupling portion 132B function like a plate spring, and length of the connecting section 130 as the plate spring becomes longer by connecting the first coupling portion 132A and the second coupling portion 132B in series with the bridging portion 131 interposed therebetween while the connecting section 130 connects the pair of beam sections 120 to each other. This reduces or prevents an excessive connecting force by the connecting section 130.

The piezoelectric device 100 according to the present preferred embodiment has improved device characteristics, particularly when the piezoelectric device 100 is used as an ultrasonic transducer, because vibration in the fundamental mode of vibration is easily generated and generation of the coupled vibration mode is reduced or prevented. Hereinafter, advantageous functions and operations of the piezoelectric device 100 when the piezoelectric device 100 according to the present preferred embodiment is used as an ultrasonic transducer will be described.

First, when generating ultrasonic waves with the piezoelectric device 100, a voltage is applied between the first connection electrode layer 20 and the second connection electrode layer 30, which are illustrated in FIG. 2. Then, a voltage is applied between the first electrode layer 12 connected to the first connection electrode layer 20 and the second electrode layer 13 connected to the second connection electrode layer 30. Further, in each of the plurality of beam sections 120, a voltage is applied between the first electrode layer 12 and the second electrode layer 13, which oppose each other with the piezoelectric layer 11 in between. Then, since the piezoelectric layer 11 expands and contracts along the in-plane direction orthogonal or substantially orthogonal to the laminating direction, each of the plurality of beam sections 120 flexuously vibrates along the laminating direction according to the above-described mechanism. This applies a force to the medium around the plurality of beam sections 120 of the piezoelectric device 100, and the medium vibrates, thereby generating ultrasonic waves.

In the piezoelectric device 100 according to the present preferred embodiment, each of the plurality of beam sections 120 has a unique mechanical resonant frequency. Thus, when the applied voltage is a sinusoidal voltage and the frequency of the sinusoidal voltage is close to the value of the resonant frequency, the amount of displacement when each of the plurality of beam sections 120 is bent increases.

When detecting ultrasonic waves by the piezoelectric device 100, the medium around each of the plurality of beam sections 120 vibrates due to the ultrasonic waves, a force is applied to each of the plurality of beam sections 120 from the medium around each of the plurality of beam sections 120, and each of the plurality of beam sections 120 flexuously vibrates. When each of the plurality of beam sections 120 flexuously vibrates, stress is applied to the piezoelectric layer 11. When stress is applied to the piezoelectric layer 11, an electric charge is induced in the piezoelectric layer 11. The electric charge induced in the piezoelectric layer 11 generates a potential difference between the first electrode layer 12 and the second electrode layer 13, which oppose each other with the piezoelectric layer 11 in between. This potential difference is detected by the first connection electrode layer 20 connected to the first electrode layer 12 and the second connection electrode layer 30 connected to the second electrode layer 13. Thus, the piezoelectric device 100 can detect ultrasonic waves.

In addition, when the ultrasonic wave to be detected includes a large number of specific frequency components and these frequency components are close to the value of the resonant frequency, the amount of displacement when each of the plurality of beam sections 120 flexuously vibrates increases. As the amount of displacement increases, the potential difference increases.

As described above, when the piezoelectric device 100 according to the present preferred embodiment is used as an ultrasonic transducer, the design of the resonant frequencies of the plurality of beam sections 120 is important. The resonant frequency varies depending on the length of each of the plurality of beam sections 120 in the extending direction, the thickness of each of the plurality of beam sections 120 in the axial direction of the central axis, the length of the fixed end portion 121 when viewed from the axial direction, and the densities and elastic moduli of the materials defining the plurality of beam sections 120. It is preferable that the plurality of beam sections have the same resonant frequency as each other. For example, when the thicknesses of the plurality of beam sections 120 are different from each other, the lengths of the plurality of beam sections 120 in the extending direction are adjusted so that the plurality of beam sections 120 has the same resonant frequency as each other.

In the piezoelectric device 100 according to Preferred Embodiment 1 of the present invention illustrated in FIGS. 1 to 3, when the resonant frequency of each of the plurality of beam sections 120 is designed to be in the vicinity of about 40 kHz, for each of the plurality of beam sections 120, for example, the piezoelectric layer 11 is made of lithium niobate, the thickness of the piezoelectric layer 11 is about 1 μm, the thickness of each of the first electrode layer 12 and the second electrode layer 13 is about 0.1 μm, the thickness of the first support portion 14a is about 0.8 μm, the thickness of the second support portion 14b is about 1.4 μm, a shortest distance from the fixed end portion 121 to the tip end portion 122 of each of the plurality of beam sections 120 is about 400 μm, and the length of the fixed end portion 121 is about 800 μm when viewed from the laminating direction.

The piezoelectric device 100 according to the present preferred embodiment includes the connecting section 130 having the above-described configuration, thereby facilitating the generation of vibration in the fundamental mode of vibration and reducing or preventing the generation of the coupled vibration mode. Thus, in a case in which the piezoelectric device 100 is used as an ultrasonic transducer, the possibility that the phases of the vibrations of the plurality of beam sections 120 differ from each other can be reduced when also detecting ultrasonic waves having the same frequency component as the resonant frequency. Further, cancellation of electric charges generated in the piezoelectric layers 11 of the plurality of beam sections 120 in the first electrode layer 12 or the second electrode layer 13 due to the different phases of the vibrations of the plurality of beam sections 120 is reduced or prevented.

Thus, in the piezoelectric device 100, the device characteristics as an ultrasonic transducer are improved.

Figure 13:
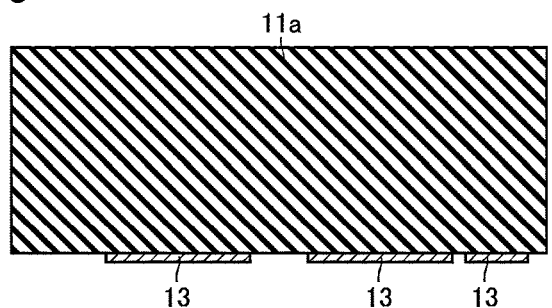
FIG. 13 is a sectional view illustrating a state in which a second electrode layer is provided on a piezoelectric single crystal substrate in a method for manufacturing the piezoelectric device according to Preferred Embodiment 1 of the present invention.

Hereinafter, a non-limiting example of a method for manufacturing the piezoelectric device 100 according to Preferred Embodiment 1 of the present invention will be described. FIG. 13 is a sectional view illustrating a state in which a second electrode layer is provided on a piezoelectric single crystal substrate in the method for manufacturing a piezoelectric device according to Preferred Embodiment 1 of the present invention. In FIG. 13 and FIGS. 14 to 19 illustrated below, the sectional views similar to that of FIG. 2 are illustrated.

As illustrated in FIG. 13, first, an adhesion layer (not illustrated) is preferably provided on a lower surface of a piezoelectric single crystal substrate 11a, and then the second electrode layer 13 is provided on the side of the adhesion layer opposite to the piezoelectric single crystal substrate 11a side. The second electrode layer 13 is formed to have a desired pattern by deposition and lift-off. The second electrode layer 13 may be formed by laminating a layer over the entire lower surface of the piezoelectric single crystal substrate 11a by sputtering and then forming a desired pattern by etching. The second electrode layer 13 and the adhesion layer may be epitaxially grown.

Figure 14:
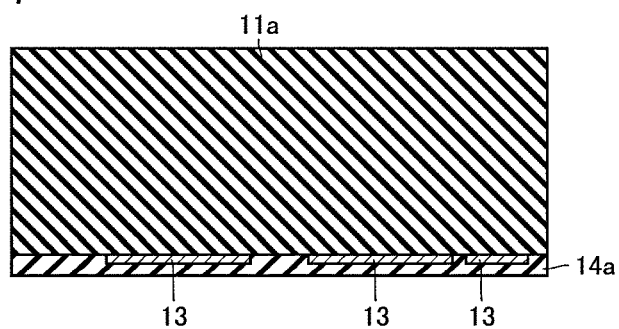
FIG. 14 is a sectional view illustrating a state in which a first support portion is provided in the method for manufacturing the piezoelectric device according to Preferred Embodiment 1 of the present invention.

FIG. 14 is a sectional view illustrating a state in which a first support portion is provided in the method for manufacturing the piezoelectric device according to Preferred Embodiment 1 of the present invention. As illustrated in FIG. 14, the first support portion 14a is provided on both the lower surfaces of the piezoelectric single crystal substrate 11a and the second electrode layer 13 by chemical vapor deposition (CVD), physical vapor deposition (PVD), or the like. Immediately after the first support portion 14a is provided, a portion of the lower surface of the first support portion 14a located on the side of the first support portion 14a opposite to the second electrode layer 13 side is raised. Thus, the lower surface of the first support portion 14a is ground and planarized by chemical mechanical polishing (CMP) or the like.

Figure 15:
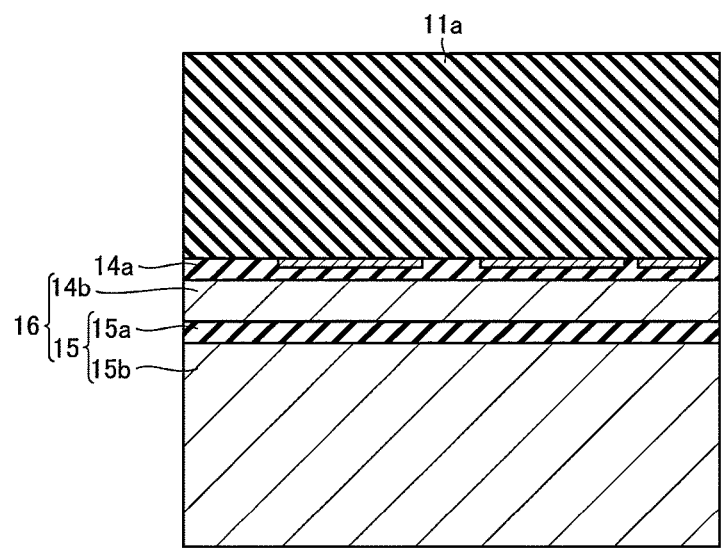
FIG. 15 is a sectional view illustrating a state in which a multilayer body is bonded to the first support portion in the method for manufacturing the piezoelectric device according to Preferred Embodiment 1 of the present invention.

FIG. 15 is a sectional view illustrating a state in which a multilayer body is bonded to the first support portion in the method for manufacturing the piezoelectric device according to Preferred Embodiment 1 of the present invention. As illustrated in FIG. 15, a multilayer body 16 including the second support portion 14b and the substrate layer 15 is bonded to the lower surface of the first support portion 14a by surface activated bonding or atomic diffusion bonding. In the present preferred embodiment, the multilayer body 16 is a silicon on insulator (SOI) substrate. Note that the yield of the piezoelectric devices 100 is improved by planarizing the upper surface of the second support portion 14b in advance by CMP or the like. When the second support portion 14b is made of low-resistance silicon, the second support portion 14b can define and function as a lower electrode layer. In this case, the formation of the second electrode layer 13 and the CMP of the lower surface of the first support portion 14a can be omitted.

Figure 16:
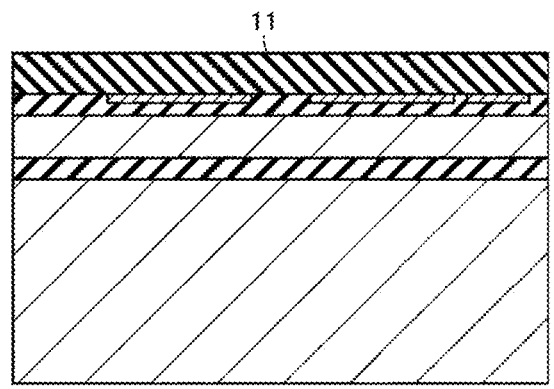
FIG. 16 is a sectional view illustrating a state in which a piezoelectric layer is formed by grinding the piezoelectric single crystal substrate in the method for manufacturing the piezoelectric device according to Preferred Embodiment 1 of the present invention.

FIG. 16 is a sectional view illustrating a state in which a piezoelectric layer is formed by grinding/polishing the piezoelectric single crystal substrate in the method for manufacturing the piezoelectric device according to Preferred Embodiment 1 of the present invention. As illustrated in FIGS. 15 and 16, the piezoelectric single crystal substrate 11a is thinned by grinding the upper surface with a grinder. By further polishing the upper surface of the thinned piezoelectric single crystal substrate 11a by CMP or the like, the piezoelectric single crystal substrate 11a is formed into the piezoelectric layer 11.

The piezoelectric single crystal substrate 11a may be formed into the piezoelectric layer 11 by injecting ions into the upper surface side of the piezoelectric single crystal substrate 11a in advance to form an exfoliation layer and separating the exfoliation layer. In addition, the upper surface of the piezoelectric single crystal substrate 11a after the exfoliation layer is separated may be further polished by CMP or the like to form the piezoelectric single crystal substrate 11a into the piezoelectric layer 11.

Figure 17:
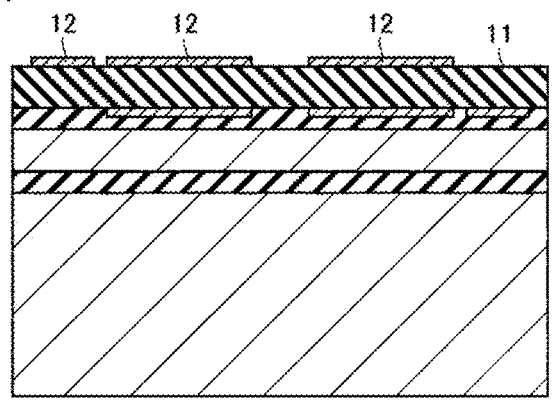
FIG. 17 is a sectional view illustrating a state in which a first electrode layer is provided on the piezoelectric layer in the method for manufacturing the piezoelectric device according to Preferred Embodiment 1 of the present invention.

FIG. 17 is a sectional view illustrating a state in which a first electrode layer is provided on the piezoelectric layer in the method for manufacturing the piezoelectric device according to Preferred Embodiment 1 of the present invention. As illustrated in FIG. 17, after an adhesion layer (not illustrated) is provided on the upper surface of the piezoelectric layer 11, the first electrode layer 12 is provided on the side of the adhesion layer opposite to the piezoelectric layer 11 side. The first electrode layer 12 is formed to have a desired pattern by deposition and lift-off. The first electrode layer 12 may preferably be formed by laminating a layer over the entire upper surface of the piezoelectric layer 11 by sputtering and then forming a desired pattern by etching. The first electrode layer 12 and the adhesion layer may be epitaxially grown.

Figure 18:
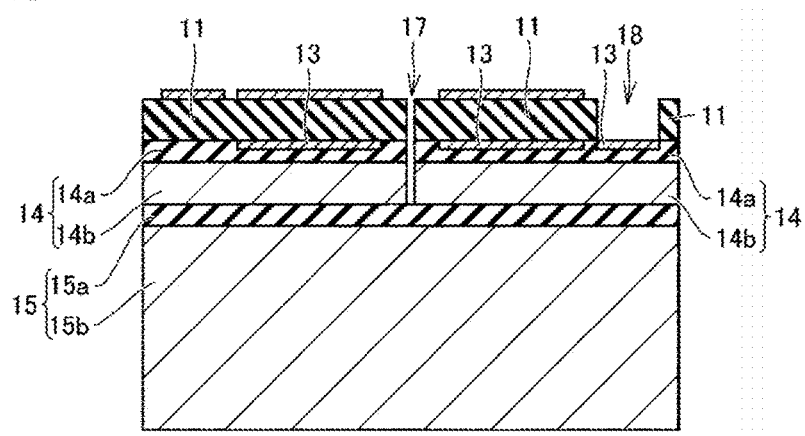
FIG. 18 is a sectional view illustrating a state in which a groove and a recess are provided in the method for manufacturing the piezoelectric device according to Preferred Embodiment 1 of the present invention.

FIG. 18 is a sectional view illustrating a state in which a groove and a recess are provided in the method for manufacturing the piezoelectric device according to Preferred Embodiment 1 of the present invention. As illustrated in FIG. 18, a slit is formed in the piezoelectric layer 11 and the first support portion 14a by dry etching with reactive ion etching (RIE) or the like in a region corresponding to a region inside the base 110 of the piezoelectric device 100 when viewed from the laminating direction. The slit may be formed by wet etching with nitrohydrofluoric acid or the like. Further, the second support portion 14b exposed to the slit is etched by deep reactive ion etching (DRIE) so that the slit reaches the upper surface of the substrate layer 15. This forms a groove 17 illustrated in FIG. 18 corresponding to the slit 141, the opening 142, and the outer peripheral slit 143 in the piezoelectric device 100 illustrated in FIGS. 1 and 2.

Further, as illustrated in FIG. 18, in the portion corresponding to the base 110 of the piezoelectric device 100, the piezoelectric layer 11 is etched by the dry etching or the wet etching so that part of the second electrode layer 13 is exposed. Thus, a recess 18 is formed.

Figure 19:
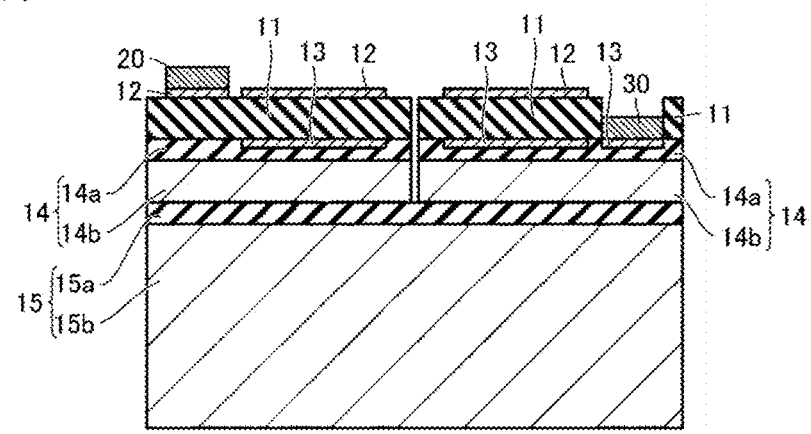
FIG. 19 is a sectional view illustrating a state in which a first connection electrode layer and a second connection electrode layer are provided in the method for manufacturing the piezoelectric device according to Preferred Embodiment 1 of the present invention.

FIG. 19 is a sectional view illustrating a state in which a first connection electrode layer and a second connection electrode layer are provided in the method for manufacturing the piezoelectric device according to Preferred Embodiment 1 of the present invention. Then, as illustrated in FIG. 19, in the portion corresponding to the base 110, adhesion layers (not illustrated) are provided on the first electrode layer 12 and the second electrode layer 13, respectively, and then the first connection electrode layer 20 and the second connection electrode layer 30 are provided on the upper surfaces of the adhesion layers, respectively, by deposition and lift-off. The first connection electrode layer 20 and the second connection electrode layer 30 may be formed by laminating a layer over the entire surfaces of the piezoelectric layer 11, the first electrode layer 12, and the exposed second electrode layer 13 by sputtering and then forming a desired pattern by etching.

Finally, of the substrate layer 15, a portion of the second substrate layer 15b is removed by DRIE, and then a portion of the first substrate layer 15a is removed by RIE. This provides the hole 101, thereby forming the plurality of beam sections 120 and the plurality of connecting sections 130, as illustrated in FIG. 2.

Through the above-described steps, the piezoelectric device 100 according to Preferred Embodiment 1 of the present invention as illustrated in FIGS. 1 to 3 is manufactured.

As described above, in the piezoelectric device 100 according to Preferred Embodiment 1 of the present invention, the connecting section 130 is provided so as to fold back between the pair of beam sections 120. The connecting section 130 includes the first coupling portion 132A, the second coupling portion 132B, and the bridging portion 131. The first coupling portion 132A extends along the slit 141 and is connected to the one of the pair of beam sections 120. The second coupling portion 132B extends along the slit 141 and is connected to the other of the pair of beam sections 120. The bridging portion 131 is located between the slit 141 and the opening 142 and is connected to both of the first coupling portion 132A and the second coupling portion 132B. The plurality of beam sections 120 are connected to each other in the circumferential direction of the base 110 having the annular shape via the connecting sections 130 while each of the plurality of beam sections 120 is interposed between the slits 141 extending in the intersecting directions.

This configuration allows, in each of the plurality of beam sections 120, the first end portions 133A or the second end portions 133B, which are stress concentration portions, can be separated from each other, thereby reducing the excitation characteristics of the piezoelectric device 100.

Also in the case of the piezoelectric device 100a according to the first modification of the present preferred Embodiment 1 of the present invention, in which the end portions of the outer peripheral slit 143 opposite to the opening 142 side are curved away from each other, in each of the plurality of beam sections 120, the first end portions 133A or the second end portions 133B that are adjacent to the end portions of the outer peripheral slits 143 on the side opposite to the opening 142 side, which are stress concentration portions, can be separated from each other, thereby reducing the excitation characteristics of the piezoelectric device 100a, as compared with the case in which the piezoelectric device described in Patent Document 1 in which the springs are disposed at the two end edges intersecting each other at the tips of the plates and the root portions of the two springs are close to each other.

In the present preferred embodiment, the outer peripheral slit 143 is further provided that extends along both of the first coupling portion 132A and the second coupling portion 132B at the distance from the slit 141 and communicates with the opening 142.

This facilitates the formation of the bridging portion 131 and reduces or prevents the interference by the pair of beam sections 120 with the operation of the connecting section 130, particularly the bridging portion 131 when the plurality of beam sections 120 vibrates.

In the present preferred embodiment, the plurality of layers 10 includes the piezoelectric layer 11, the first electrode layer 12, and the second electrode layer 13. The piezoelectric layer 11 is made of a single crystal piezoelectric material. The first electrode layer 12 is on the one side of the piezoelectric layer 11 in the laminating direction of the plurality of layers 10. The second electrode layer 13 is on the other side of the piezoelectric layer 11 so as to oppose at least a portion of the first electrode layer 12 with the piezoelectric layer 11 in between. The axial direction of the virtual axis when the polarization axis of the single crystal piezoelectric material is projected from the laminating direction onto the virtual plane orthogonal or substantially orthogonal to the laminating direction extends in the same direction in all of the plurality of beam sections 120, and intersects the extending direction of each of the plurality of beam sections 120 when viewed from the laminating direction.

This enables the piezoelectric device 100 in which the piezoelectric layer 11 is made of a single crystal piezoelectric material having a polarization axis to reduce deviation of stress distribution generated in the connecting section 130 and to suppress damage of the connecting section 130 even when thermal stress is generated in each of the pair of beam sections 120.

In the piezoelectric device 100 according to Preferred Embodiment 1 of the present invention, when viewed from the laminating direction, the angle between the extending direction of each of the plurality of beam sections 120 and the axial direction of the virtual axis is preferably, for example, about 40 degrees or more and about 50 degrees or less or about 130 degrees or more and about 140 degrees or less.

Accordingly, even when thermal stress is generated in the plurality of beam sections 120, the plurality of beam sections 120 each has substantially the same stress distribution in the extending directions, so that the degrees of warping of the plurality of beam sections 120 are also substantially the same. This reduces or prevents deterioration of the device characteristics of the piezoelectric device 100.

In the present preferred embodiment, the piezoelectric layer 11 is made of, for example, lithium niobate (LiNbO$_3$) or lithium tantalate (LiTaO$_3$).

This can improve the piezoelectricity of the piezoelectric layer 11, thereby improving the device characteristics of the piezoelectric device 100.

Preferred Embodiment 2

Hereinafter, a piezoelectric device according to Preferred Embodiment 2 of the present invention will be described. The piezoelectric device according to Preferred Embodiment 2 of the present invention is different from the piezoelectric device 100 according to Preferred Embodiment 1 of the present invention in that the dimensions of extension length, the minimum width, and the thickness of each of the first coupling portion and the second coupling portion are defined. For this reason, the description of the configuration similar to that of the piezoelectric device 100 according to Preferred Embodiment 1 of the present invention will not be repeated.

Figure 20:
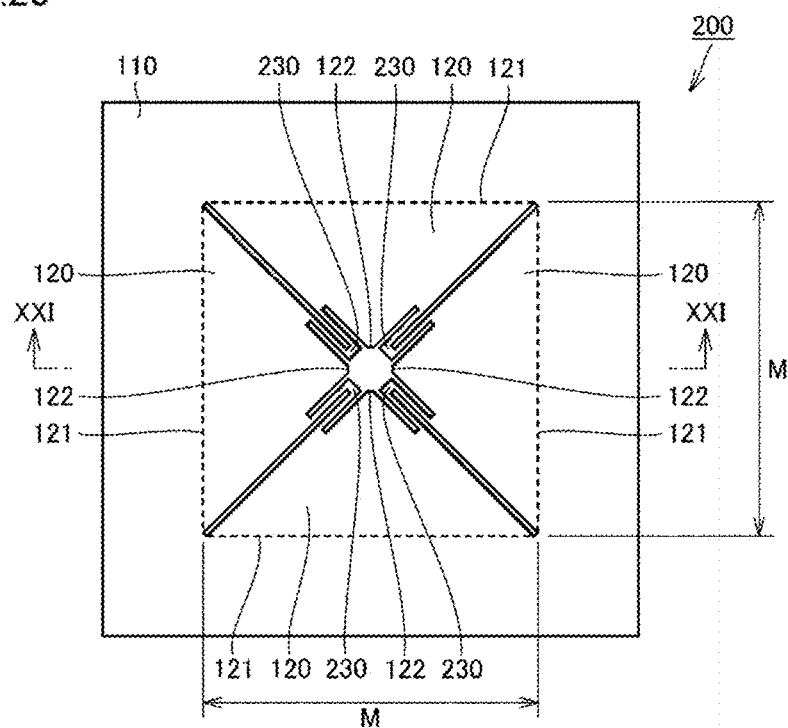
FIG. 20 is a plan view of a piezoelectric device according to Preferred Embodiment 2 of the present invention.
Figure 21:
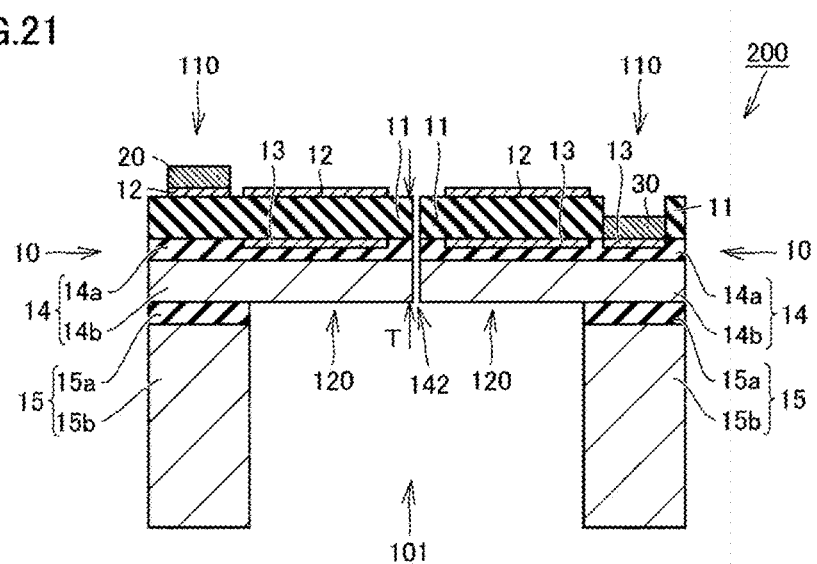
FIG. 21 is a sectional view of the piezoelectric device illustrated in FIG. 20 taken along line XXI-XXI.
Figure 22:
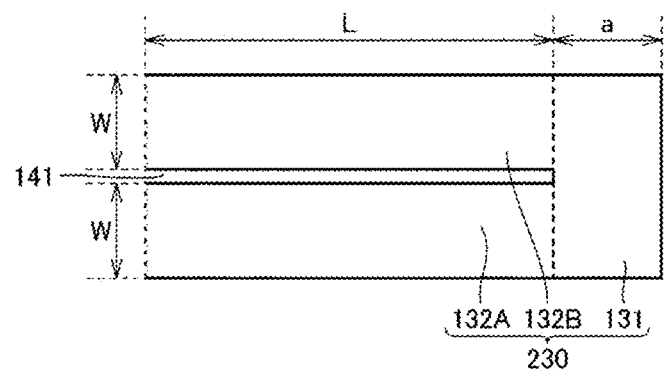
FIG. 22 is a partial plan view illustrating a configuration of a connecting section of the piezoelectric device according to Preferred Embodiment 2 of the present invention.

FIG. 20 is a plan view of the piezoelectric device according to Preferred Embodiment 2 of the present invention. FIG. 21 is a sectional view of the piezoelectric device illustrated in FIG. 20 taken along line XXI-XXI. FIG. 22 is a partial plan view illustrating a configuration of a connecting section of the piezoelectric device according to Preferred Embodiment 2 of the present invention. In FIG. 21, individual layers are illustrated thicker for clarity.

As illustrated in FIGS. 20 to 22, a piezoelectric device 200 according to Preferred Embodiment 2 of the present invention includes the base 110, the four beam sections 120, and four connecting sections 230. The fixed end portions 121 of the four beam sections 120 are located to define a square when viewed from the laminating direction. The dimension of a shortest distance M between the fixed end portions 121 opposing each other among the fixed end portions 121 of the four beam sections 120 when viewed from the laminating direction illustrated in FIG. 20 is a dimension measured along a straight line that passes through the fixed end portion 121 and the tip end portion 122 of the beam section 120 having one fixed end portion 121 of the fixed end portions 121 opposing each other in the shortest distance.

The connecting section 230 connects the pair of beam sections 120 adjacent to each other among the four beam sections 120. The connecting section 230 has the bridging portion 131, the first coupling portion 132A, and the second coupling portion 132B.

In the present preferred embodiment, each of the first coupling portion 132A, the second coupling portion 132B, and the bridging portion 131 linearly extends while having a constant width. The dimension of the minimum width W of each of the first coupling portion 132A and the second coupling portion 132B is equal to the dimension of the maximum width a of the bridging portion 131.

In the piezoelectric device 200, when the force for connecting the beam sections 120 by the connecting section 230 is too weak, the coupled vibration mode is likely to occur. The ease of occurrence of the coupled vibration mode can be quantified by the resonant frequency of the coupled vibration mode and the resonant frequency of the fundamental mode of vibration. The further apart these resonant frequencies are, the more the coupled vibration mode is reduced or prevented.

Here, the resonant frequency of the coupled vibration mode varies depending on the ratio of flexural rigidities of the four beam sections 120 and the four connecting sections 230 in an out-of-plane direction. In each of the beam section 120 and the connecting section 230, the flexural rigidity mainly depends on parameters such as thickness and length as well as hardnesses and densities of materials.

The four beam sections 120 and the four connecting sections 230 are different from each other in that the beam section 120 includes the first electrode layer 12 and the connecting section 230 does not include the first electrode layer 12. However, since the beam section 120 and the connecting section 230 have substantially the same laminated structure, the thicknesses, hardnesses, and densities of the beam section 120 and the connecting section 230 are substantially the same. Thus, the ratio of the flexural rigidities varies greatly depending on the difference in length between the beam section 120 and the connecting section 230. That is, the resonant frequency of the coupled vibration mode can be varied by adjusting the ratio of the dimension of extension length L of each of the first coupling portion 132A and the second coupling portion 132B to the dimension of the shortest distance M between the fixed end portions 121.

In general, in an acoustic device using the flexural vibration of the thin beam section 120 as in the present preferred embodiment, a Q value at resonance is reduced or prevented to approximately 10 due to a load by air resistance. This allows, for example, more than half of the energy at resonance to be input to the piezoelectric device 200 even when the piezoelectric device 200 is used at a frequency shifted by ±5% from the resonant frequency, thereby widening a usable band. In particular, when the piezoelectric device 200 is manufactured in large quantities by micro-electro-mechanical systems (MEMS) processing, the resonant frequency may vary by, for example, approximately ±5% due to the processing accuracy of the MEMS. However, in the piezoelectric device 200 having a wide usable band as described above, it is possible to suppress a large variation in the characteristics of the piezoelectric device 200.

However, when the resonant frequency of the coupled vibration mode exists within the above-described usable band, the energy input to the piezoelectric device 200 is absorbed as the vibration energy of the coupled vibration mode instead of the fundamental mode of vibration. In this case, conversion efficiency of the piezoelectric device 200 is lowered, and the Q value of the coupled vibration mode is high, resulting in a longer reverberant vibration after the drive of the piezoelectric device 200 is stopped.

In view of this problem, it is preferable that the resonant frequency of the coupled vibration mode be higher than the resonant frequency of the fundamental mode of vibration by, for example, about 5% or more. Thus, simulation analysis was performed for different dimensions of the minimum width W of each of the first coupling portion 132A and the second coupling portion 132B to determine the relationship between the ratio of the dimension of the extension length L of each of the first coupling portion 132A and the second coupling portion 132B to the dimension of the shortest distance M between the fixed end portions 121, and the ratio of the difference between a secondary resonant frequency and a primary resonant frequency to the primary resonant frequency in each of the four beam sections 120. The primary resonant frequency corresponds to the resonant frequency of the fundamental mode of vibration, and the secondary resonant frequency corresponds to the resonant frequency of the coupled vibration mode.

As simulation analysis conditions, in the piezoelectric device 200 according to the present preferred embodiment, the dimension of the shortest distance M between the fixed end portions 121 was 800 μm, the dimension of the thickness of the piezoelectric layer 11 was 1 μm, and the thickness of the support layer 14 was 2 μm. That is, the dimension of the thickness T illustrated in FIG. 21 was set to about 3 μm. The thickness T corresponds to the thickness of each of the first coupling portion 132A and the second coupling portion 132B in the laminating direction. The dimension of the minimum width W of each of the first coupling portion 132A and the second coupling portion 132B was set to three different widths of about 6 μm, about 10 μm, and about 15 μm.

Figure 23:
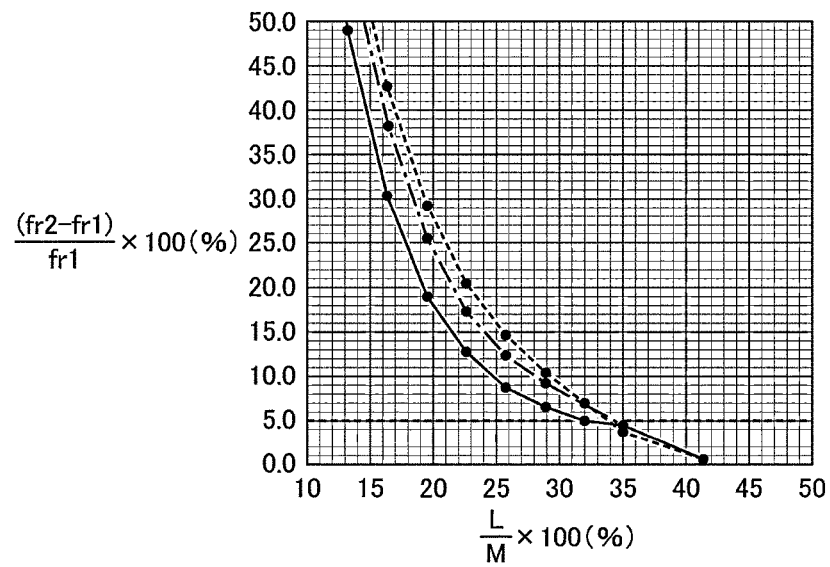
FIG. 23 is a graph showing the results of simulation analysis.

FIG. 23 is a graph showing the results of the simulation analysis. In FIG. 23, the vertical axis represents the ratio (%) of the difference between the secondary resonant frequency fr2 and the primary resonant frequency fr1 to the primary resonant frequency fr1 in each of the four beam sections 120, and the horizontal axis represents the ratio (%) of the dimension of the extension length L of each of the first coupling portion 132A and the second coupling portion 132B to the dimension of the shortest distance M between the fixed end portions 121. The data when the dimensions of the minimum width W of each of the first coupling portion 132A and the second coupling portion 132B are about 6 μm, about 10 μm, and about 15 μm are shown as a solid line, an alternate long and short dash line, and a dotted line, respectively. Further, a reference line in which the ratio of the difference between the secondary resonant frequency fr2 and the primary resonant frequency fr1 to the primary resonant frequency fr1 in each of the four beam sections is about 5% is indicated by a dotted line.

As shown in FIG. 23, a tendency was observed that as the ratio of the dimension of the extension length L of each of the first coupling portion 132A and the second coupling portion 132B to the dimension of the shortest distance M between the fixed end portions 121 [(L/M)×100(%)] increases, the ratio of the difference between the secondary resonant frequency fr2 and the primary resonant frequency fr1 to the primary resonant frequency fr1 in each of the four beam sections 120 [(fr2−fr1)/fr1×100(%)] decreases.

When the ratio of the dimension of the extension length L of each of the first coupling portion 132A and the second coupling portion 132B to the dimension of the shortest distance M between the fixed end portions 121 [(L/M)×100 (%)] is 32% or less, the ratio of the difference between the secondary resonant frequency fr2 and the primary resonant frequency fr1 to the primary resonant frequency fr1 in each of the four beam sections 120 [(fr2−fr1)/fr1×100(%)] is 5% or more in all of the dimensions of the minimum width W of each of the first coupling portion 132A and the second coupling portion 132B of 6 μm, 10 μm, and 15 μm.

Thus, in the present preferred embodiment, when viewed from the laminating direction, the ratio of the dimension of the extension length L of each of the first coupling portion 132A and the second coupling portion 132B to the dimension of the shortest distance M between the fixed end portions 121 opposing each other among the fixed end portions 121 of the four beam sections 120 is 32% or less. This makes it possible to suppress the generation of the coupled vibration mode, thereby reducing or preventing a decrease in the conversion efficiency of the piezoelectric device 200 and a long reverberant vibration after the drive of the piezoelectric device 200 is stopped.

As described above, the resonant frequency of the coupled vibration mode varies depending on the ratio of the flexural rigidities of the four beam sections 120 and the four connecting sections 230 in the out-of-plane direction. When the dimension of the minimum width W of each of the first coupling portion 132A and the second coupling portion 132B is smaller than the dimension of the thickness T of each of the first coupling portion 132A and the second coupling portion 132B in the laminating direction, the flexural rigidities of the four beam sections 120 and the four connecting sections 230 in the in-plane direction are lower than the flexural rigidities in the out-of-plane direction. In this case, the resonant frequency of the coupled vibration mode is close to the resonant frequency of the fundamental mode of vibration, and it may be difficult to secure [(fr2−fr1)/fr1×100(%)] by 5% or more.

Thus, in the present preferred embodiment, the dimension of the minimum width W of each of the first coupling portion 132A and the second coupling portion 132B is larger than the dimension of the thickness T of each of the first coupling portion 132A and the second coupling portion 132B in the laminating direction. This makes it possible to suppress the generation of the coupled vibration mode, thereby reducing or preventing a decrease in the conversion efficiency of the piezoelectric device 200 and a long reverberant vibration after the drive of the piezoelectric device 200 is stopped.

Note that the shape of the connecting section 230 to which limitation by the above parameters is applicable is not limited to the above-described shape. Here, shapes of connecting sections according to modifications to which the limitation by the above parameters is applicable will be described. In the following description of the modifications, the description of the same configuration as that of the connecting section 230 of the piezoelectric device 200 according to Preferred Embodiment 2 of the present invention will not be repeated.

Figure 24:
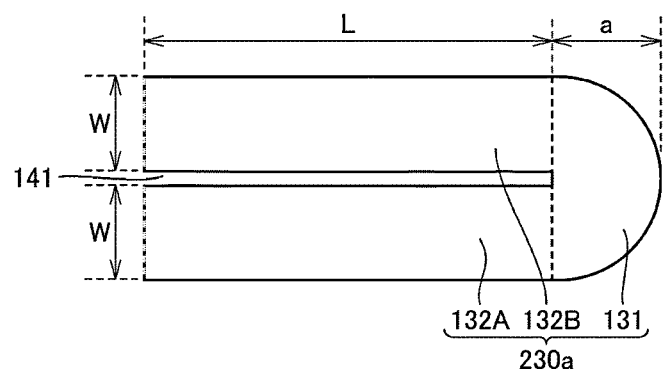
FIG. 24 is a partial plan view illustrating the shape of a connecting section of a piezoelectric device according to a first modification of Preferred Embodiment 2 of the present invention.

FIG. 24 is a partial plan view illustrating the shape of a connecting section of a piezoelectric device according to a first modification of Preferred Embodiment 2 of the present invention. As illustrated in FIG. 24, in the first modification of Preferred Embodiment 2 of the present invention, the bridging portion 131 in a connecting section 230a has a semicircular shape with a radius a centered at the tip of the slit 141. The dimension of the minimum width W of each of the first coupling portion 132A and the second coupling portion 132B is equal to the dimension of the maximum width a of the bridging portion 131.

Figure 25:
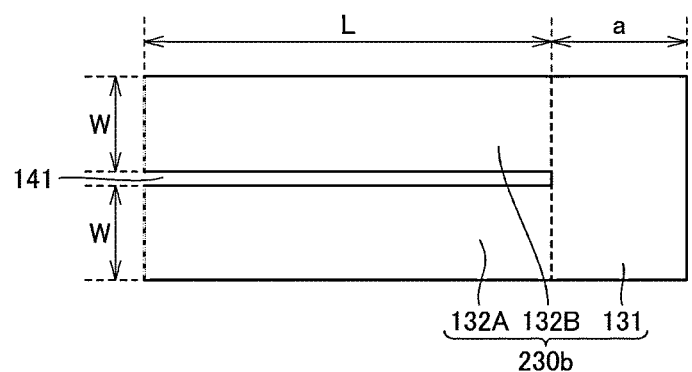
FIG. 25 is a partial plan view illustrating the shape of a connecting section of a piezoelectric device according to a second modification of Preferred Embodiment 2 of the present invention.

FIG. 25 is a partial plan view illustrating the shape of a connecting section of a piezoelectric device according to a second modification of Preferred Embodiment 2 of the present invention. As illustrated in FIG. 25, in the second modification of Preferred Embodiment 2 of the present invention, each of the first coupling portion 132A, the second coupling portion 132B, and the bridging portion 131 in a connecting section 230b linearly extends while having a constant width. The dimension of the minimum width W of each of the first coupling portion 132A and the second coupling portion 132B is smaller than the dimension of the maximum width a of the bridging portion 131. The dimension of the maximum width a of the bridging portion 131 is equal to or less than twice the dimension of the minimum width W of each of the first coupling portion 132A and the second coupling portion 132B.

Figure 26:
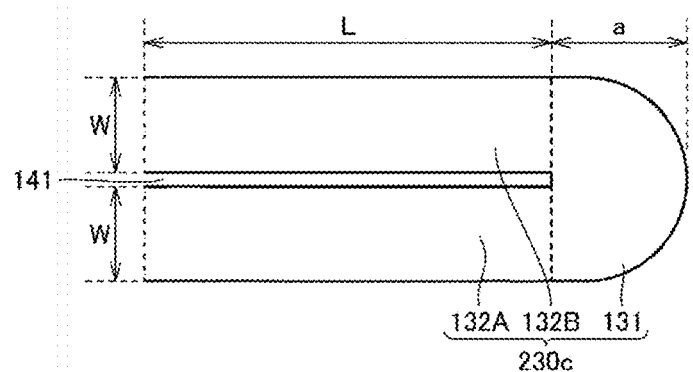
FIG. 26 is a partial plan view illustrating the shape of a connecting section of a piezoelectric device according to a third modification of Preferred Embodiment 2 of the present invention.

FIG. 26 is a partial plan view illustrating the shape of a connecting section of a piezoelectric device according to a third modification of Preferred Embodiment 2 of the present invention. As illustrated in FIG. 26, in the third modification of Preferred Embodiment 2 of the present invention, the bridging portion 131 in a connecting section 230c preferably has a semicircular shape with a radius centered at the tip of the slit 141. The dimension of the minimum width W of each of the first coupling portion 132A and the second coupling portion 132B is smaller than the dimension of the maximum width a of the bridging portion 131. The dimension of the maximum width a of the bridging portion 131 is equal to or less than twice the dimension of the minimum width W of each of the first coupling portion 132A and the second coupling portion 132B.

Figure 27:
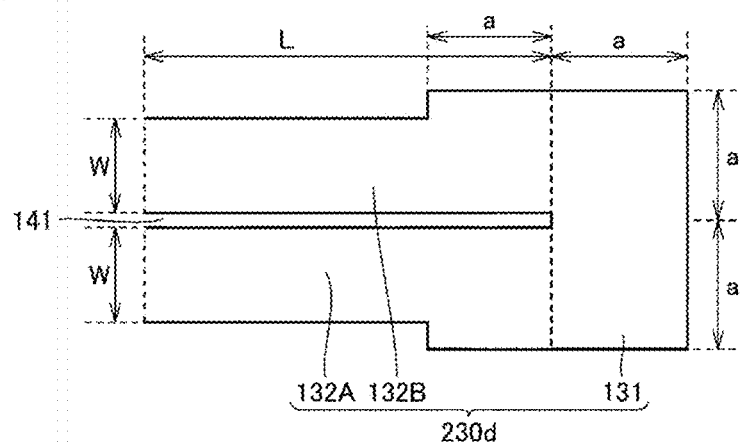
FIG. 27 is a partial plan view illustrating the shape of a connecting section of a piezoelectric device according to a fourth modification of Preferred Embodiment 2 of the present invention.

FIG. 27 is a partial plan view illustrating the shape of a connecting section of a piezoelectric device according to a fourth modification of Preferred Embodiment 2 of the present invention. As illustrated in FIG. 27, in the fourth modification of Preferred Embodiment 2 of the present invention, each of bridging portion side portions of the first coupling portion 132A and the second coupling portion 132B and the bridging portion 131 in a connecting section 230d has a shape along a virtual square with a side length of 2a centered at the tip of the slit 141. The dimension of the minimum width W of each of the first coupling portion 132A and the second coupling portion 132B is smaller than the dimension of the maximum width a of the bridging portion 131. The dimension of the maximum width a of the bridging portion 131 is equal to or less than twice the dimension of the minimum width W of each of the first coupling portion 132A and the second coupling portion 132B.

Figure 28:
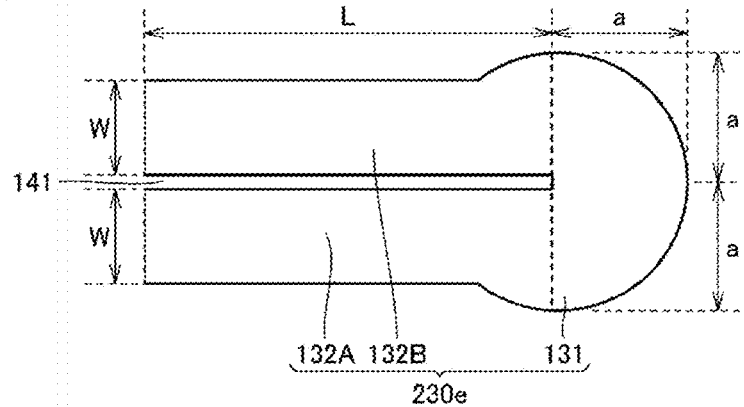
FIG. 28 is a partial plan view illustrating the shape of a connecting section of a piezoelectric device according to a fifth modification of Preferred Embodiment 2 of the present invention.

FIG. 28 is a partial plan view illustrating the shape of a connecting section of a piezoelectric device according to a fifth modification of Preferred Embodiment 2 of the present invention. As illustrated in FIG. 28, in the fifth modification of Preferred Embodiment 2 of the present invention, each of bridging portion side portions of the first coupling portion 132A and the second coupling portion 132B and the bridging portion 131 in a connecting section 230e has a shape along a virtual circle with a radius a centered at the tip of the slit 141. The dimension of the minimum width W of each of the first coupling portion 132A and the second coupling portion 132B is smaller than the dimension of the maximum width a of the bridging portion 131. The dimension of the maximum width a of the bridging portion 131 is equal to or less than twice the dimension of the minimum width W of each of the first coupling portion 132A and the second coupling portion 132B.

Figure 29:
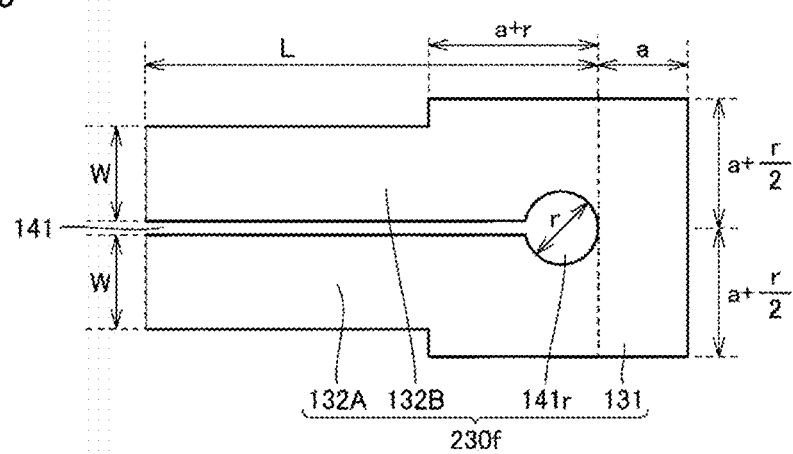
FIG. 29 is a partial plan view illustrating the shape of a connecting section of a piezoelectric device according to a sixth modification of Preferred Embodiment 2 of the present invention.

FIG. 29 is a partial plan view illustrating the shape of a connecting section of a piezoelectric device according to a sixth modification of Preferred Embodiment 2 of the present invention. As illustrated in FIG. 29, in the sixth modification of Preferred Embodiment 2 of the present invention, a circular opening 141r having a diameter r is preferably provided at the tip of the slit 141. The dimension of the diameter r is larger than the dimension of the width of the slit 141 and is equal to or smaller than the dimension of the minimum width W of each of the first coupling portion 132A and the second coupling portion 132B. Each of bridging portion side portions of the first coupling portion 132A and the second coupling portion 132B and the bridging portion 131 in a connecting section 230f has a shape along a virtual square with a side length of (2a+r) centered at the center of the opening 141r. The dimension of the minimum width W of each of the first coupling portion 132A and the second coupling portion 132B is equal to or smaller than the dimension of the maximum width a of the bridging portion 131. The dimension of the maximum width a of the bridging portion 131 is equal to or less than twice the dimension of the minimum width W of each of the first coupling portion 132A and the second coupling portion 132B.

Figure 30:
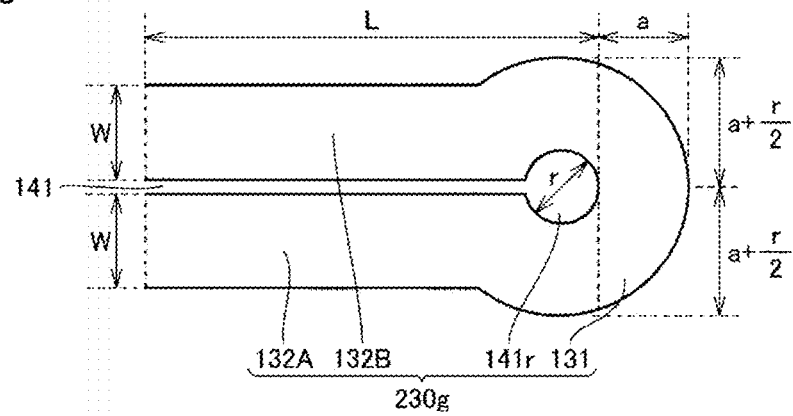
FIG. 30 is a partial plan view illustrating the shape of a connecting section of a piezoelectric device according to a seventh modification of Preferred Embodiment 2 of the present invention.

FIG. 30 is a partial plan view illustrating the shape of a connecting section of a piezoelectric device according to a seventh modification of Preferred Embodiment 2 of the present invention. As illustrated in FIG. 30, in the seventh modification of Preferred Embodiment 2 of the present invention, the circular opening 141r having the diameter r is formed at the tip of the slit 141. The dimension of the diameter r is larger than the dimension of the width of the slit 141 and is equal to or smaller than the dimension of the minimum width W of each of the first coupling portion 132A and the second coupling portion 132B. Each of bridging portion side portions of the first coupling portion 132A and the second coupling portion 132B and the bridging portion 131 in a connecting section 230g has a shape along a virtual circle with a radius of (a+r/2) centered at the center of the opening 141r. The dimension of the minimum width W of each of the first coupling portion 132A and the second coupling portion 132B is equal to or smaller than the dimension of the maximum width a of the bridging portion 131. The dimension of the maximum width a of the bridging portion 131 is equal to or less than twice the dimension of the minimum width W of each of the first coupling portion 132A and the second coupling portion 132B.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A piezoelectric device comprising:
a base having an annular shape;
a plurality of beam sections each of which includes a fixed end portion connected to the base and a tip end portion located on a side opposite to the fixed end portion and extends from the fixed end portion toward the tip end portion; and
a connecting section that connects, among the plurality of beam sections, a pair of beam sections adjacent to each other in a circumferential direction of the base; wherein
each of the plurality of beam sections is a piezoelectric vibrating section including a plurality of layers;
a slit defined by portions of a pair of end edges of adjacent ones of the pair of beam sections and an opening located adjacent to the tip end portions of the pair of beam sections while the opening is spaced apart from the slit and defined by other portions of the pair of end edges are provided between the pair of beam sections;
the connecting section is provided to fold back between the pair of beam sections;
the connecting section includes a first coupling portion extending along the slit and connected to one of the pair of beam sections, a second coupling portion extending along the slit and connected to another of the pair of beam sections, and a bridging portion located between the slit and the opening and connected to both of the first coupling portion and the second coupling portion; and
the plurality of beam sections are connected to each other in the circumferential direction via the connecting section while each of the plurality of beam sections is interposed between slits extending in intersecting directions.

2. The piezoelectric device according to claim 1, further comprising an outer peripheral slit extending along each of the first coupling portion and the second coupling portion at a distance from the slit and communicating with the opening.

3. The piezoelectric device according to claim 1, wherein the plurality of layers include:
a piezoelectric layer made of a single crystal piezoelectric material;
a first electrode layer located on one side of the piezoelectric layer in a laminating direction of the layers; and
a second electrode layer located on another side of the piezoelectric layer to oppose at least a portion of the first electrode layer with the piezoelectric layer in between; and
an axial direction of a virtual axis when a polarization axis of the single crystal piezoelectric material is projected from the laminating direction onto a virtual plane orthogonal or substantially orthogonal to the laminating direction extends in a same direction in all of the plurality of beam sections and intersects an extending direction of each of the plurality of beam sections when viewed from the laminating direction.

4. The piezoelectric device according to claim 3, wherein an angle defined by the axial direction of the virtual axis and the extending direction of each of the plurality of beam sections when viewed from the laminating direction is about 40 degrees or more and about 50 degrees or less, or about 130 degrees or more and about 140 degrees or less.

5. The piezoelectric device according to claim 3, wherein the piezoelectric layer is made of lithium niobate ($LiNbO_3$) or lithium tantalate ($LiTaO_3$).

6. The piezoelectric device according to claim 1, wherein the plurality of beam sections include four beam sections;
the fixed end portions of the four beam sections are located to define a square when viewed from a laminating direction; and
when viewed from the laminating direction, a ratio of a dimension of an extension length of each of the first coupling portion and the second coupling portion to a dimension of a shortest distance between the fixed end portions opposing each other among the fixed end portions of the four beam sections is about 32% or less.

7. The piezoelectric device according to claim 1, wherein a dimension of a minimum width of each of the first coupling portion and the second coupling portion is larger than a dimension of a thickness of each of the first coupling portion and the second coupling portion in a laminating direction.

8. The piezoelectric device according to claim 6, wherein the connecting section includes four connecting sections.

9. The piezoelectric device according to claim 1, wherein the plurality of beam sections are rotationally symmetric around a center of the base.

10. The piezoelectric device according to claim 1, wherein a total length of each of the plurality of beam sections in an extending direction is at least five times or more than a total thickness of each of the plurality of beam sections in a laminating direction.

11. The piezoelectric device according to claim 3, wherein a total width of the slit when viewed from the laminating direction is about 10 µm or less.

12. The piezoelectric device according to claim 1, wherein total lengths of the first coupling portion and the second coupling portion are about 10 µm or more and about 200 µm or less.

13. The piezoelectric device according to claim 1, wherein a side surface of the bridging portion which is in contact with the opening is curved.

14. The piezoelectric device according to claim 3, wherein a total thickness of each of the first electrode layer and the second electrode layer is about 0.05 µm or more and about 0.2 µm or less.

15. The piezoelectric device according to claim 1, wherein a hole is provided in the base adjacent to the opening.

16. The piezoelectric device according to claim 1, wherein each of the plurality of beam sections has a same or substantially a same resonant frequency.

17. The piezoelectric device according to claim 1, wherein each of the plurality of beam sections and the connecting section have the same or substantially the same thicknesses, hardness, and density.

18. The piezoelectric device according to claim 1, wherein the bridging portion has a semicircular shape with a radius centered at the slit.

19. The piezoelectric device according to claim 1, wherein a circular opening is provided at a tip of the slit.

20. The piezoelectric device according to claim 19, wherein a diameter of the circular opening is larger than a width of the slit.

* * * * *